(12) United States Patent
Nakazawa

(10) Patent No.: US 8,723,174 B2
(45) Date of Patent: May 13, 2014

(54) THIN FILM TRANSISTOR, CONTACT STRUCTURE, SUBSTRATE, DISPLAY DEVICE, AND METHODS FOR MANUFACTURING THE SAME

(75) Inventor: Makoto Nakazawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/701,379

(22) PCT Filed: Apr. 27, 2011

(86) PCT No.: PCT/JP2011/002484
§ 371 (c)(1),
(2), (4) Date: Nov. 30, 2012

(87) PCT Pub. No.: WO2011/151970
PCT Pub. Date: Dec. 8, 2011

(65) Prior Publication Data
US 2013/0069061 A1    Mar. 21, 2013

(30) Foreign Application Priority Data
Jun. 2, 2010  (JP) .................. 2010-126746

(51) Int. Cl.
*H01L 27/105*    (2006.01)

(52) U.S. Cl.
USPC ............. 257/43; 257/52; 257/57; 257/72; 257/59; 257/83

(58) Field of Classification Search
USPC .............. 257/43, 52, 57, 72, 83, E29.273
See application file for complete search history.

(56) References Cited

U.S. PATENT DOCUMENTS

| 7,297,977 | B2 | 11/2007 | Hoffman et al. |
| 7,382,421 | B2 | 6/2008  | Hoffman et al. |
| 7,732,819 | B2 | 6/2010  | Akimoto et al. |
| 7,791,072 | B2 | 9/2010  | Kumomi et al. |
| 7,868,326 | B2 | 1/2011  | Sano et al. |
| 2005/0039670 | A1 | 2/2005 | Hosono et al. |
| 2007/0072439 | A1 | 3/2007 | Akimoto et al. |
| 2007/0278490 | A1 | 12/2007 | Hirao et al. |
| 2008/0035920 | A1 | 2/2008 | Takechi et al. |
| 2008/0038882 | A1 | 2/2008 | Takechi et al. |

(Continued)

FOREIGN PATENT DOCUMENTS

| EP | 1 983 499 A1 | 10/2008 |
| JP | 2007-123861 A | 5/2007 |

(Continued)

OTHER PUBLICATIONS

Official Communication issued in International Patent Application No. PCT/JP2011/002484, mailed on Aug. 9, 2011.

*Primary Examiner* — Tran Tran
(74) *Attorney, Agent, or Firm* — Keating & Bennett, LLP

(57) ABSTRACT

A TFT 17 provided on a substrate 3 is provided. The TFT 17 includes a gate electrode 31, a gate insulating film 32, a semiconductor 33, a source electrode 34, a drain electrode 35, and a protection film 36. The semiconductor 33 includes a metal oxide semiconductor. The semiconductor 33 has a source portion 33*a* which is in contact with the source electrode 34, a drain portion 33*b* which is in contact with the drain electrode 35, and a channel portion 33*c* which is exposed through the source electrode 34 and the drain electrode 35. A conductive layer 37 having a relatively small electrical resistance is formed in each of the source portion 33*a* and the drain portion 33*b*. The conductive layer 37 is removed from the channel portion 33*c*.

10 Claims, 17 Drawing Sheets

(56) References Cited

U.S. PATENT DOCUMENTS

| | | |
|---|---|---|
| 2008/0142797 A1 | 6/2008 | Lee et al. |
| 2009/0001374 A1 | 1/2009 | Inoue et al. |
| 2010/0035378 A1 | 2/2010 | Chang |
| 2010/0320471 A1 | 12/2010 | Takechi et al. |

FOREIGN PATENT DOCUMENTS

| | | |
|---|---|---|
| JP | 2007-235102 A | 9/2007 |
| JP | 2008-040343 A | 2/2008 |
| JP | 2008-042088 A | 2/2008 |
| JP | 2008-141113 A | 6/2008 |
| JP | 4164562 B2 | 10/2008 |
| JP | 2009-528670 A | 8/2009 |

FIG.4
(a) 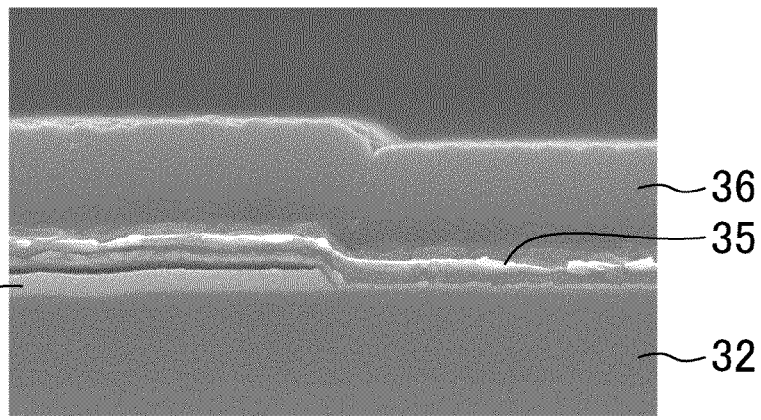
(b) 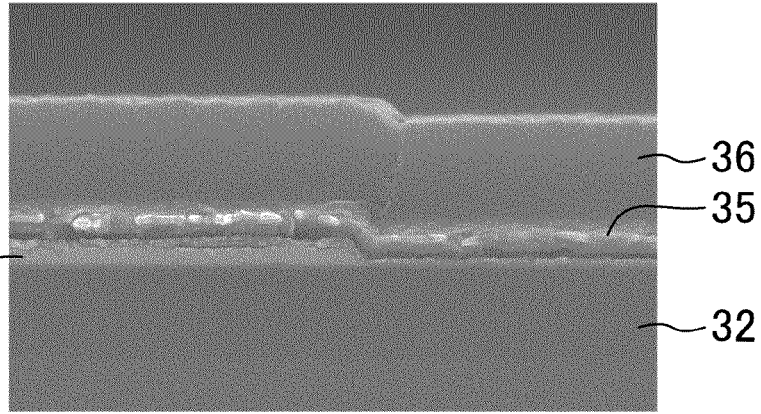

FIG.19
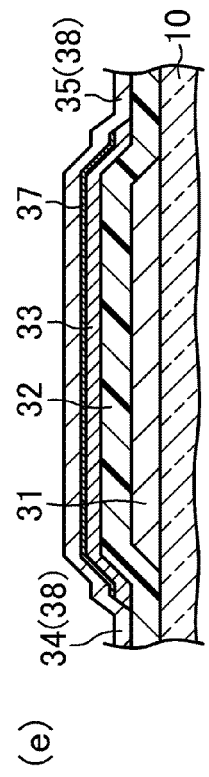
(a)
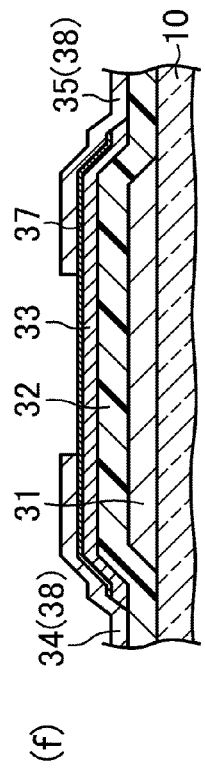
(b)
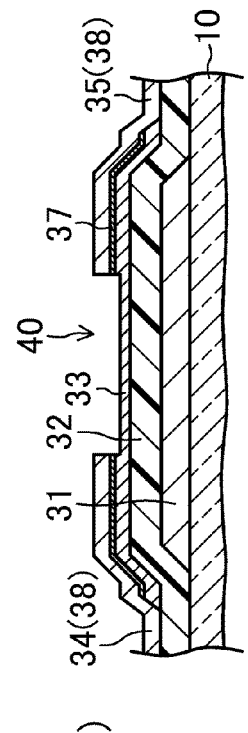
(c)
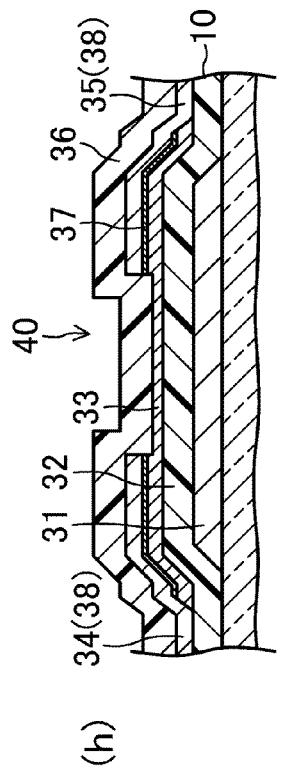
(d)
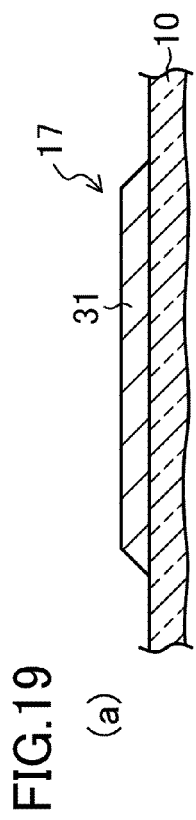
(e)
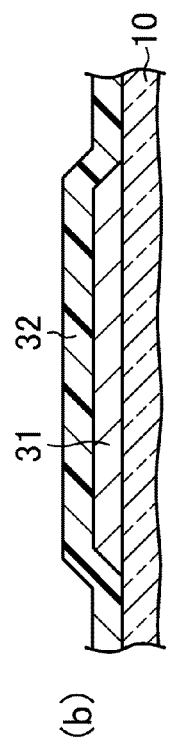
(f)
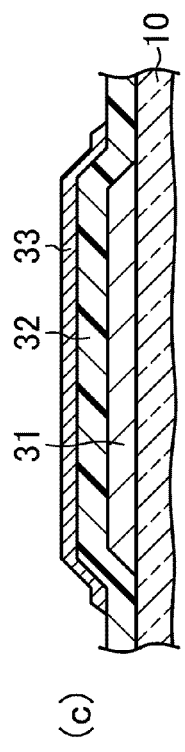
(g)
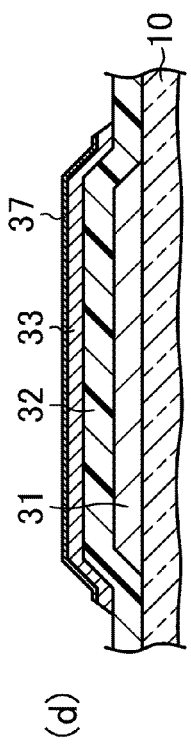
(h)

FIG.21
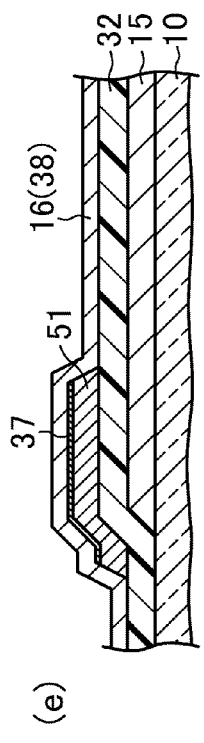
(a)
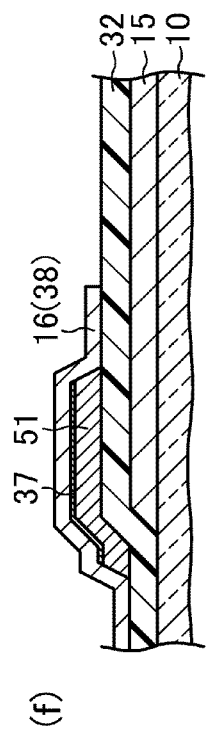
(b)
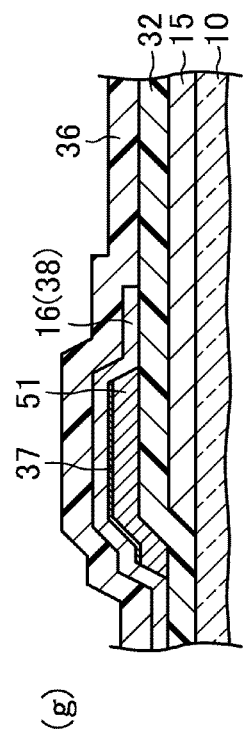
(c)
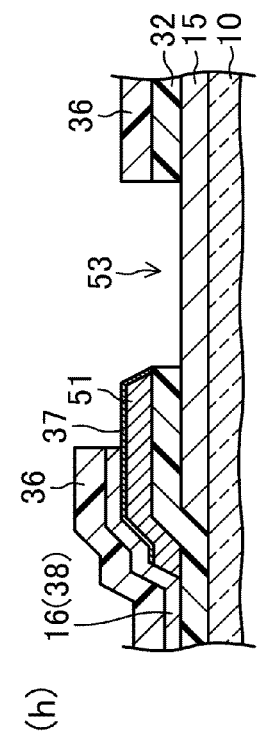
(d)
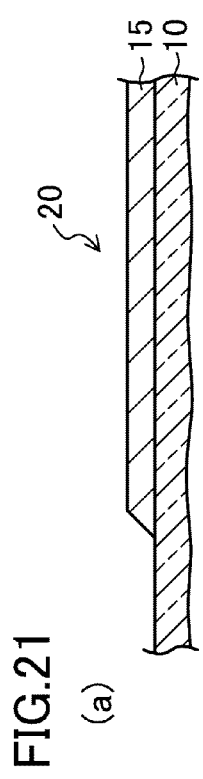
(e)
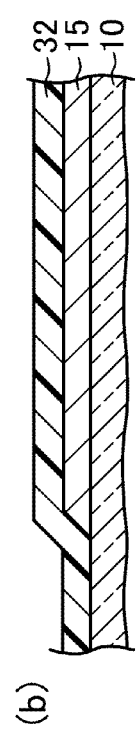
(f)
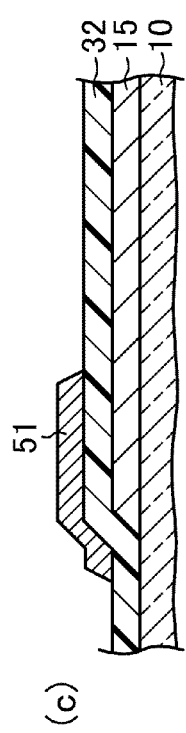
(g)
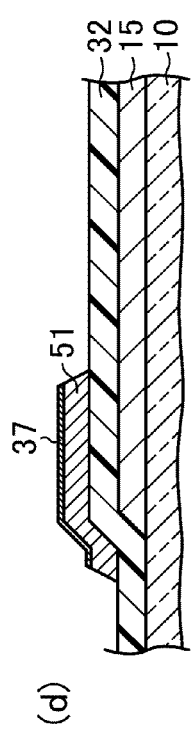
(h)

THIN FILM TRANSISTOR, CONTACT STRUCTURE, SUBSTRATE, DISPLAY DEVICE, AND METHODS FOR MANUFACTURING THE SAME

TECHNICAL FIELD

The present invention relates to display devices, such as a liquid crystal display etc., and more particularly, to thin film transistors, contact structures, etc. including a metal oxide semiconductor which are provided on the substrate of the display device.

BACKGROUND ART

In a thin film transistor (TFT) employing a metal oxide semiconductor, an insulating protection layer (etch stopper) is typically formed on the semiconductor layer in order to ensue the reliability of the channel portion. In this case, the source and drain electrodes are connected to the semiconductor layer via two connection holes (contact holes) which are formed in the protection layer.

In the structure, however, it is necessary to highly precisely form the two contact holes with a predetermined clearance, and therefore, it is disadvantageously difficult to provide a high-precision small transistor. It is also disadvantageously difficult to ensure a stable connection using the minute contact hole. Moreover, at a portion where the metal oxide semiconductor and the electrode are joined together, if oxygen contained in the metal oxide semiconductor migrates to the electrode, an oxide is formed on the surface of the electrode and acts as an electrical barrier, so that an appropriate ohmic contact may not be ensured.

To address the above problems, a TFT has been described in which the channel portion, the source portion, the drain portion, and the pixel electrode are formed of a metal oxide semiconductor, and the resistance of a partial region including the contact hole of the metal oxide semiconductor film is reduced (PATENT DOCUMENT 1). PATENT DOCUMENT 1 also describes a bottom-gate TFT as an application of the TFT and the user of $InGaZnO_4$ as the metal oxide semiconductor.

PATENT DOCUMENT 1 also describes that in the metal oxide semiconductor film, oxygen vacancies in the film act as electron donors, that if oxygen is removed, electrons left in oxygen vacancies act as carriers through the semiconductor, and that the conductivity of the metal oxide semiconductor can be reduced by a plasma treatment etc.

In the TFT, after an uppermost protection insulating film is formed, an opening is formed in the protection insulating film so that a part of the channel portion etc. is exposed to reducing plasma through the opening, whereby a low-resistant region is formed in the channel portion etc.

PATENT DOCUMENT 1 also describes that, in order to provide a satisfactory ohmic contact between the source signal line and the metal oxide semiconductor, the metal oxide semiconductor film is formed into a desired island shape by patterning, and thereafter, a hydrogen plasma treatment is performed, and thereafter, a source metal film is formed on the metal oxide semiconductor film, and patterning is performed on the source metal film to form the source signal line.

Note that the hydrogen plasma treatment and the source metal film formation are successively performed without being exposed to the atmosphere, and thereafter, a protection insulating film is formed on the source signal line and the metal oxide semiconductor film. The plasma treatment is performed after this series of processes.

CITATION LIST

Patent Document

PATENT DOCUMENT 1: Japanese Patent Publication No. 2008-40343

SUMMARY OF THE INVENTION

Technical Problem

When the resistance of only a part of the metal oxide semiconductor film is reduced by the opening as in the TFT of PATENT DOCUMENT 1, the resistance of the metal oxide semiconductor film around a portion exposed through the opening is also reduced in addition to the portion exposed through the opening. Therefore, for example, when the resistances of the source and drain portions are reduced, the resistance of the channel portion between the source and drain portions may also be unexpectedly reduced, leading to unstable transistor characteristics.

If a hydrogen plasma treatment is performed on the metal oxide semiconductor film after patterning, the resistance of the entire surface of the metal oxide semiconductor film is reduced. The resistance of the surface of a portion corresponding to the channel portion of the metal oxide semiconductor film is also reduced, and therefore, the transistor characteristics may be degraded.

Therefore, it is an object of the present invention to provide a thin film transistor etc. having better electrical characteristics and reliability.

Solution to the Problem

To achieve the object, in the present invention, a thin film transistor and a contact structure have been devised by utilizing characteristics of a metal oxide semiconductor.

According to an aspect of the present invention, a thin film transistor (TFT) provided on a substrate is provided. The TFT includes a gate electrode, a gate insulating film covering the gate electrode, a semiconductor facing the gate electrode with the gate insulating film being interposed between the semiconductor and the gate electrode, a source electrode and a drain electrode connected together via the semiconductor, and a protection film covering the semiconductor, the source electrode, and the drain electrode.

The semiconductor includes a metal oxide semiconductor. The semiconductor has a source portion having an upper surface in contact with the source electrode, a drain portion in contact with the drain electrode at an upper surface spaced apart from the source electrode, and a channel portion having an upper surface exposed between the source and drain portions. A conductive layer having a relatively small electrical resistance is formed on an upper surface portion of each of the source and drain portions. The conductive layer is removed from an upper surface portion of the channel portion.

In the TFT, the conductive layer is formed in a portion of the semiconductor with which the source electrode is in contact and in a portion of the semiconductor with which the drain electrode is in contact. Therefore, satisfactory adhesiveness can be obtained between the source electrode etc. and the semiconductor, as described in detail below. Therefore, stable conductivity can be ensured between the source electrode etc. and the semiconductor, whereby the electrical characteristics can be improved.

Moreover, the conductive layer is removed from the upper surface portion of the channel portion, whereby the metal oxide semiconductor can exhibit its inherent characteristics, and therefore, the reliability of the transistor characteristics can be improved.

According to another aspect of the present invention, a contact structure (first contact structure) provided on a substrate is provided. The contact structure includes a gate line, a gate insulating film covering the gate line, a first terminal provided on the gate insulating film in the vicinity of the gate line, a first electrode connected to the first terminal, a protection film covering the first terminal and the first electrode, and a second electrode provided on the protection film and connected to the first electrode via the first terminal.

The first terminal includes a metal oxide semiconductor. The first terminal has a first connection portion having an upper surface in contact with the first electrode, a covered portion in contact with the protection film at an upper surface spaced apart from the first electrode, and a first exposed portion having an upper surface exposed between the first connection portion and the covered portion through the first electrode and the protection film. A conductive layer having a relatively small electrical resistance is formed on an upper surface portion of each of the first connection portion and the first exposed portion. The second electrode is in contact with the upper surface of the first exposed portion.

The metal oxide semiconductor inherently does not have conductivity under normal conditions, and therefore, the first terminal does not function as a terminal. In contrast to this, in the contact structure, the conductive layer having conductivity is formed on the first terminal, and therefore, a different electrode can be electrically connected via the conductive layer to the first terminal, whereby the first terminal is allowed to function as a terminal.

Moreover, the first terminal also functions as an etch stopper. In the contact structure, for example, in order to connect the second electrode provided above the protection film to the first electrode below the protection film, the protection film is etched to expose the first exposed portion through the protection film. In this case, the gate insulating film may also be etched, and the gate line located below the gate insulating film may be exposed. If the gate line is exposed, then when the first and second electrodes are connected together, the gate line may also be connected to the first and second electrodes. In contrast to this, in the contact structure, the first terminal is provided on the gate insulating film, and therefore, the etching action is not allowed to reach the gate insulating film, whereby the gate line can be prevented from being connected to the first electrode etc.

The first and second electrodes can be made in surface contact with each other by using the first terminal, resulting in stable connection and therefore an improvement in electrical characteristics. Because the first terminal has the same configuration as that of the semiconductor, the first terminal can be formed simultaneously with the semiconductor of the thin film transistor. Therefore, the amount or number of materials and steps can be reduced, resulting in higher productivity.

According to still another aspect of the present invention, a contact structure (second contact structure) provided on a substrate is provided. The contact structure includes an auxiliary gate electrode, a gate insulating film covering the auxiliary gate electrode, a second terminal provided on the gate insulating film, a third electrode connected to the second terminal, a protection film covering the second terminal and the third electrode, and a connection electrode provided on the protection film and connected to the third electrode via the second terminal.

The second terminal includes a metal oxide semiconductor including a conductive layer having a relatively small electrical resistance in an upper surface portion thereof. The second terminal has a third connection portion having an upper surface in contact with the third electrode and covered by the protection film, and a second exposed portion having an upper surface exposed through or covered by the third electrode and exposed through the protection film. An electrode exposed portion at which an upper surface of the auxiliary gate electrode is exposed through the gate insulating film is formed in the vicinity of the second exposed portion. The connection electrode is in contact with the upper surfaces of the electrode exposed portion and the second exposed portion.

In this contact structure, as in the above first contact structure, the conductive layer is formed on the second terminal of the metal oxide semiconductor, and therefore, the second terminal can function as a terminal, and can provide stable connection by surface contact. The second terminal can be formed simultaneously with the semiconductor of the thin film transistor, and can also function as an etch stopper which protects the gate insulating film.

Moreover, in the contact structure, the auxiliary gate electrode provided below the gate insulating film and the third electrode provided above the gate insulating film are connected together, and therefore, the second exposed portion and the electrode exposed portion can be simultaneously exposed by utilizing the etching action, resulting in higher productivity.

According to still another aspect of the present invention, an active matrix drive type substrate is provided. The substrate includes a plurality of source lines extending in parallel to each other, a plurality of gate lines extending in parallel to each other perpendicularly to the source lines, a plurality of pixel electrodes provided in respective grid-square-like subregions separated by the source lines and the gate lines, and a plurality of thin film transistors corresponding to the respective pixel electrodes.

The thin film transistor is the above thin film transistor. The gate electrode is connected to the gate line, the source electrode is connected to the source line, and the drain electrode is connected to the pixel electrode.

In the substrate, the above TFT is employed, whereby transistor characteristics having higher reliability can be provided, and images can be stably displayed.

In particular, the above contact structure is preferably provided in a connection portion between the drain electrode and the pixel electrode, and the first electrode preferably serves as the drain electrode, and the second electrode preferably serves as the pixel electrode.

In this case, the drain electrode and the pixel electrode can be stably connected together.

More preferably, the substrate further includes a plurality of auxiliary capacitor lines extending in parallel to the gate lines, a common line extending in parallel to the source lines and connected to all of the auxiliary capacitor lines, and a plurality of capacitors connected to the respective corresponding drain electrodes and the respective corresponding auxiliary capacitor lines. The second contact structure is provided at a connection portion between the auxiliary capacitor line and the common line. The auxiliary gate electrode serves as the auxiliary capacitor line, and the third electrode serves as the common line.

In this case, the auxiliary gate electrode and the common line can also be stably connected together.

In this case, the metal oxide semiconductors of the semiconductor, the first terminal, and the second terminal are preferably formed of the same material.

In this case, the semiconductor, the first terminal, and the second terminal can be simultaneously formed, resulting in higher productivity.

The metal oxide semiconductor of at least one of the first and second terminals may have portions having different thicknesses.

For example, by intentionally causing the metal oxide semiconductor to have different thicknesses at the etch stopper portions of the first and second terminals, etc., the function of each component can be more effectively exhibited.

Specifically, the metal oxide semiconductor may contain at least one of In, Ga, and Zn.

Moreover, the pixel electrode and the connection electrode are preferably formed of the same material.

In this case, the pixel electrode and the connection electrode are also simultaneously formed, resulting in even higher productivity.

If a display device includes the above substrate, the reliability of the display device is improved because of the better electrical characteristics of the TFT etc.

The above TFT may be manufactured by a method including a conductive layer forming step of exposing an upper surface portion of the semiconductor to plasma containing at least one of fluorine, hydrogen, and boron, to form the conductive layer in the upper surface portion, and a conductive layer removing step of removing the conductive layer of the channel portion from the semiconductor.

An upper surface portion of the semiconductor can be altered by exposing to plasma containing an element, such as fluorine etc., whereby the conductive layer can be formed. The conductive layer allows the source and drain portions and the source and drain electrodes to adhere to each other. By removing the conductive layer from the channel portion of the semiconductor, the metal oxide semiconductor at the channel portion can be restored to its inherent state, whereby satisfactory transistor characteristics can be obtained.

The above first contact structure may be manufactured by a method including a conductive layer forming step of exposing an upper surface portion of the first terminal to plasma containing at least one of fluorine, hydrogen, and boron, to form the conductive layer in the upper surface portion, a first electrode forming step of forming the first electrode having a predetermined pattern, a protection film forming step of forming the protection film to cover the first terminal and the first electrode, a contact hole forming step of etching the protection film using a fluorine-containing gas to expose the upper surface of the first exposed portion, and a second electrode forming step of forming the second electrode having a predetermined pattern in contact with the upper surface of the first exposed portion.

In the method, for example, after the conductive layer is formed on the first terminal, the first electrode is formed by patterning. Next, the protection film is formed to cover the first terminal and the first electrode. Thereafter, the protection film is etched using a fluorine-based gas to form the contact hole through which the first exposed portion of the first terminal is exposed. In this case, although the fluorine-based gas acts on the gate insulating film as well as the protection film, the first terminal provided above the gate insulating film can protect the gate insulating film below the first terminal.

The metal oxide semiconductor is also altered by the fluorine-based gas to have a reduced resistance, and therefore, a conductive layer can be newly formed in an exposed surface of the first terminal or the conductive layer can be enhanced.

The second contact structure may be manufactured by a method including a conductive layer forming step of exposing the upper surface portion of the second terminal to plasma containing at least one of fluorine, hydrogen, and boron, to form the conductive layer in the upper surface portion, a third electrode forming step of forming the third electrode having a predetermined pattern, a protection film forming step of forming the protection film to cover the second terminal and the third electrode, a contact hole forming step of etching the protection film using a fluorine-containing gas to expose the upper surface of each of the second exposed portion and the electrode exposed portion, and a connection electrode forming step of forming the connection electrode having a predetermined pattern in contact with the upper surface of each of the second exposed portion and the electrode exposed portion.

With this method, when the contact hole is formed in the protection film, not only the second exposed portion but also the electrode exposed portion can be simultaneously exposed. Therefore, the number of steps can be reduced, resulting in higher productivity.

The above substrate may be manufactured, for example, by a method including the following steps.

A film of a predetermined conductive material is formed on the substrate, and performing patterning on the film, to form the gate line, the gate electrode, and the auxiliary capacitor line (gate line-and-the-like forming step). A film of a predetermined insulating material is formed to form the gate insulating film to cover the gate line, the gate electrode, and the auxiliary capacitor line (gate insulating film forming step). The semiconductor, the first terminal, and the second terminal are formed on the gate insulating film (semiconductor-and-the-like forming step). After the semiconductor-and-the-like forming step, a film of a predetermined conductive material is formed, and patterning is performed on the film, to form the source line, the source electrode, the drain electrode, and the common line (source line-and-the-like forming step). After the source line-and-the-like forming step, the conductive layer of the channel portion is removed from the semiconductor (conductive layer removing step). A film of a predetermined insulating material is formed to form the protection film to cover the source line, the source electrode, the drain electrode, and the common line (protection film forming step).

The semiconductor-and-the-like forming step includes a semiconductor patterning step of forming a metal oxide semiconductor film and performing patterning on the metal oxide semiconductor film, and a conductive layer forming step of, before or after the semiconductor patterning step, exposing an upper surface of the metal oxide semiconductor to plasma containing at least one of fluorine, hydrogen, and boron.

By the above series of steps, the above TFT, first terminal, and second terminal can be simultaneously formed.

Moreover, by providing the following steps in addition to the above steps, the pixel electrode and the connection electrode can be simultaneously formed.

The protection film is etched using a fluorine-containing gas to expose the upper surface of each of the first and second exposed portions and the electrode exposed portion (contact hole forming step). After the contact hole forming step, a film of a predetermined conductive material is formed, and patterning is performed on the film, to form the pixel electrode and the connection electrode (pixel electrode-and-the-like forming step).

In the above manufacturing methods, in particular, the plasma of the conductive layer forming step preferably contains at least one element of fluorine and boron.

In this case, as described in detail below, a stable conductive layer can be formed, and the restoration of the resistance value of the conductive layer by annealing etc. can be reduced or prevented.

Advantages of the Invention

As described above, according to the present invention, a TFT etc. having better electrical characteristics and reliability can be formed without impairing the productivity.

BRIEF DESCRIPTION OF THE DRAWINGS

FIG. 4 is a photograph showing a cross-section of a main portion of a semiconductor. FIG. 4(a) shows a case where a plasma treatment was not performed, and FIG. 4(b) shows a case where a plasma treatment was performed.

FIGS. 19(a)-19(h) are cross-sectional views schematically showing a process of forming a TFT of the second embodiment.

FIGS. 21(a)-21(h) are cross-sectional views schematically showing a process of forming a second contact structure of the second embodiment.

DESCRIPTION OF EMBODIMENTS

Embodiments of the present invention will be described in detail hereinafter with reference to the accompanying drawings. Note that the above embodiments are merely exemplary in nature and are in no way intended to limit the scope of the present invention, its application, or uses.

First Embodiment

<Display Device>

Figure 1:
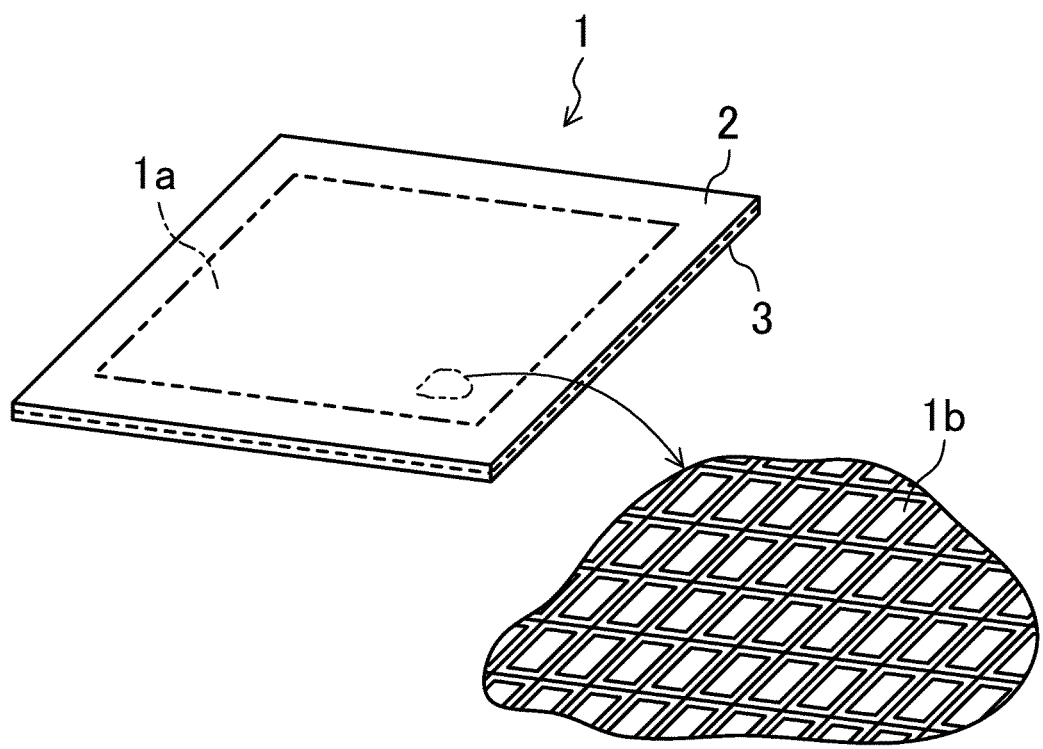
FIG. 1 is a perspective view schematically showing a liquid crystal display according to a first embodiment.

FIG. 1 shows a panel 1 of a liquid crystal display (display device) according to this embodiment to which the present invention is applied. The liquid crystal display is a color display which can display moving images. A plurality of pixels are arranged in a matrix in a display region 1a of the panel 1. Note that the present invention is not limited to liquid crystal displays and is applicable to organic EL displays.

The panel 1 is formed by bonding a pair of substrates 2 and 3 together with a liquid crystal layer (not shown) being enclosed between the substrates 2 and 3. The substrate 2 is a CF substrate on which red, green, and blue color filters are arranged in a predetermined pattern. The substrate 3 is an active matrix drive type TFT substrate. On the TFT substrate 3, thin film transistors (TFTs 17) and contact structures 19 and 20 are provided by stacking films which are each formed of a conductive or insulating material having a predetermined pattern together on a base substrate 10 (see FIGS. 3, 5, and 6).

<TFT Substrate>

Figure 2:
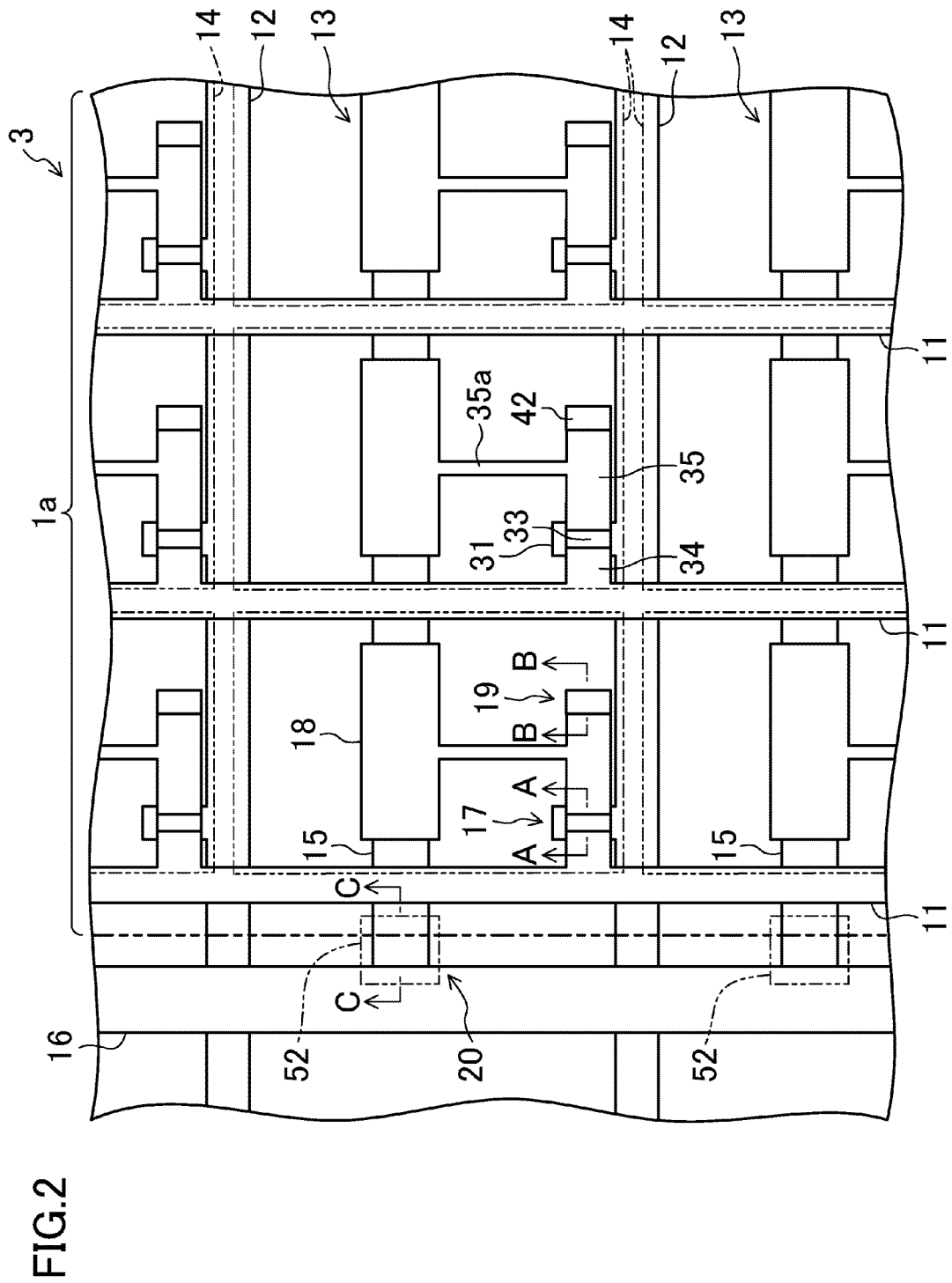
FIG. 2 is an enlarged plan view schematically showing a main portion of a TFT substrate.

FIG. 2 is an enlarged view of a main portion (a left end portion of the display region 1a) of the TFT substrate 3. In FIG. 2, the display region 1a is located on the right side of a dot-dot-dash line. In the display region 1a, source lines 11 and gate lines 12 are formed in a matrix. The display region 1a is divided into sub-regions (transparent portions 13) arranged in a grid pattern. One rectangular pixel electrode 14 is provided in each grid-square-like sub-region, corresponding to each pixel 1b. The pixel electrode 14 of this embodiment is formed of ITO, which is transparent and has excellent conductivity. The base substrate 10 is an insulating substrate of glass or resin, etc. In this embodiment, a glass substrate is employed.

Specifically, the gate lines 12 extend in parallel to each other in a horizontal direction (row direction), and the source lines 11 extend in parallel to each other in a vertical direction (column direction) perpendicular to the horizontal direction. An auxiliary capacitor line 15 extending in parallel to the gate line 12 is provided between any two adjacent gate lines 12 and 12. A common line 16 extending in parallel to the source lines 11 is provided outside the display region 1a. One end of each auxiliary capacitor line 15 is connected to the common line 16.

The TFT 17 is provided in each transparent portion 13 in the vicinity of an intersection portion between the gate line 12 and the source line 11 (a lower left side of FIG. 2), corresponding to each pixel electrode 14. A capacitor 18 is provided at a middle portion of each transparent portion 13, overlapping the auxiliary capacitor line 15 extending across the transparent portion 13 as viewed above. The capacitor 18 is connected to the auxiliary capacitor line 15. The pixel electrode 14 and the capacitor 18 are each connected to the source line 11 via the TFT 17.

In this embodiment, as described below, the TFT 17, a connection portion (first contact structure 19) between the pixel electrode 14 and the TFT 17, and a connection portion (second contact structure 20) between the common line 16 and the auxiliary capacitor line 15, are devised to improve their electrical characteristics.

<TFT>

Figure 3:
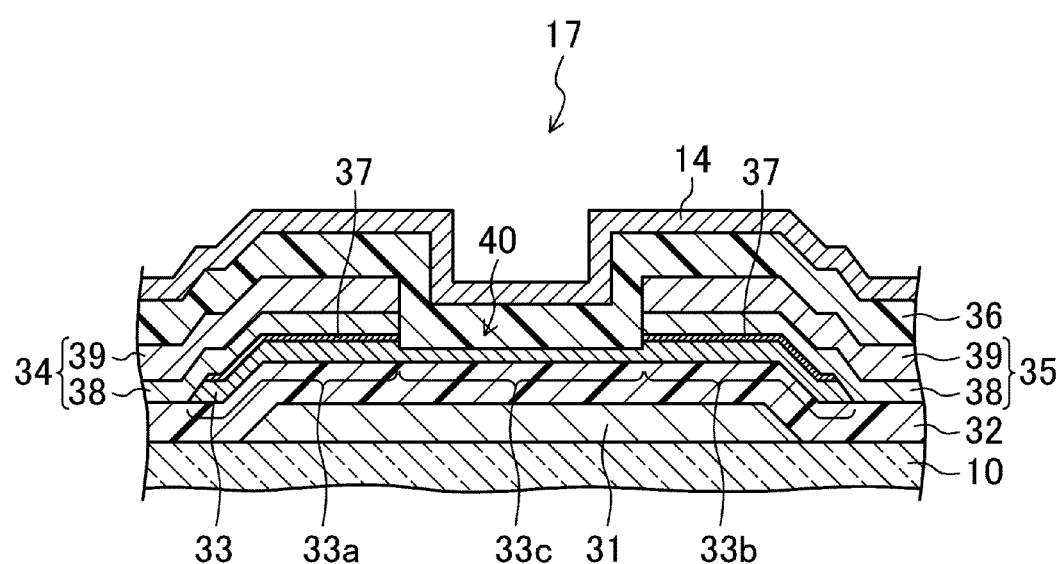
FIG. 3 is a cross-sectional view schematically showing a range indicated by an arrow A of FIG. 2.

As shown in detail in FIG. 3, the TFT 17 of this embodiment has an inverted staggered (bottom-gate) structure, and is provided on the base substrate 10. The TFT 17 includes a gate electrode 31, a gate insulating film 32, a semiconductor 33, a source electrode 34, a drain electrode 35, a protection film 36, etc.

The gate electrode 31 is integrally formed with the gate line 12, and protrudes toward the transparent portion 13 from a portion of the gate line 12 located in the vicinity of the intersection portion between the gate line 12 and the source line 11. The gate electrode 31 etc. are formed of a material having excellent conductivity, such as a metal (e.g., titanium (Ti), aluminum (Al), etc.) or an oxide thereof, or a multilayer structure thereof, etc. In this embodiment, the gate electrode 31 etc. have a multilayer (three-layer) structure including an Al layer sandwiched between Ti layers (Ti/Al/Ti). Note that the auxiliary capacitor line 15 is formed of the same material as that of the gate electrode 31 etc. These components are successively integrally formed by patterning.

The gate insulating film 32 is provided to insulate the source electrode 34 etc. provided above the gate insulating film 32 from the gate electrode 31 etc. provided below the gate insulating film 32. The gate electrode 31 etc. are covered by the gate insulating film 32. The gate insulating film 32 is preferably formed of a material having high insulating properties (excellent step coverage), and in addition, high permittivity and low leakage current. Examples of such a material include silicon oxide film, silicon nitride film, alumina ($Al_2O_3$) film, or multilayer film thereof, etc. In this embodiment, silicon oxide film is used. The gate insulating film 32 has a thickness of about 250 nm.

The semiconductor 33 is disposed to face the gate electrode 31 with the gate insulating film 32 being interposed between the semiconductor 33 and the gate electrode 31. The semiconductor 33 is a metal oxide semiconductor. Specifically, an amorphous metal oxide semiconductor (In—Ga—Zn—O, and also referred to as IGZO) containing indium (In), gallium (Ga), and zinc (Zn) is employed. Note that the present invention is not limited to IGZO, and other metal oxide semiconductors, such as ZnO, Zn—Sn—O, $SrTiO_3$, $In_2O_3$, $CuAlO_2$, etc., may be employed. An upper surface portion of the semiconductor 33 is altered to form a conductive layer 37 (described below). The source electrode 34 and the drain electrode 35 are connected together via the semiconductor 33.

The source electrode 34 is integrally formed with the source line 11, and protrudes toward the transparent portion 13 from a portion of the source line 11 located in the vicinity of the intersection portion between the source line 11 and the gate line 12. The protruding portion of the source electrode 34 is in contact with the upper surface of the semiconductor 33.

The drain electrode 35 extends away from the source electrode 34 with the semiconductor 33 being interposed between the drain and source electrodes 35 and 34 while one end portion of the drain electrode 35 is in contact with a portion of the upper surface of the semiconductor 33 which is spaced apart from the source electrode 34. An extending portion 35a extends from a side edge of the drain electrode 35 toward a middle portion of the transparent portion 13. The drain electrode 35 and the capacitor 18 are connected together via the extending portion 35a. The other end portion of the drain electrode 35 is connected to the pixel electrode 14 by a first terminal 42.

A tip of the end portion of the source electrode 34 and a tip of the end portion of the drain electrode 35 which are connected to the semiconductor 33 face each other over a predetermined distance. Therefore, the semiconductor 33 has a portion whose upper surface is in contact with the source electrode 34, a portion whose upper surface is in contact with the drain electrode 35, and a portion between these portions at which the upper surface of the semiconductor 33 is exposed.

These portions are referred to as a source portion 33a, a drain portion 33b, and a channel portion 33c, respectively, for the sake of convenience.

The source electrode 34, the source line 11, and the drain electrode 35 are formed of the same material that has excellent conductivity, similar to the gate electrode 31 etc. In this embodiment, a multilayer (two-layer) structure (Al/Ti) in which an Al layer 39 is put on top of a Ti layer 38 is employed. Therefore, the Ti layer 38 (lower layer) is in contact with the semiconductor 33. These components are successively integrally formed by patterning.

The protection film 36 (passivation film) is provided to protect the semiconductor 33, the source electrode 34, and the drain electrode 35. The semiconductor 33 etc. are covered by the protection film 36. In the TFT 17, the protection film 36 is in contact with the upper surfaces of the source electrode 34, the drain electrode 35, and the channel portion 33c of the semiconductor 33. The protection film 36 is formed of a material similar to that of the gate insulating film 32, i.e., any material having excellent insulating properties. In this embodiment, a silicon oxide film having a thickness of about 250 nm is employed. Note that the pixel electrode 14 is formed above the protection film 36.

(Conductive Layer)

The conductive layer 37 having a significantly smaller electrical resistance than those of other portions is formed in upper surface portions of the source and drain portions 33a and 33b of the semiconductor 33. The conductive layer 37 is provided to enhance the adhesiveness to the source electrode 34 etc., and is formed by exposing the upper surface of the semiconductor 33 to plasma containing fluorine, hydrogen, or boron (described in detail below).

FIG. 4 shows cross-sectional structures which were obtained when a plasma treatment was performed on the upper surface of the semiconductor 33 and when a plasma treatment was not performed on the upper surface of the semiconductor 33. FIG. 4(a) shows the case where a plasma treatment was not performed, and FIG. 4(b) shows the case where a plasma treatment was performed. As can be seen from these figures, when a plasma treatment was not performed, a gap was observed between the upper surface of the semiconductor 33 and the drain electrode 35, and when a plasma treatment was performed, the semiconductor 33 and the drain electrode 35 were integrally formed.

Therefore, by altering the surface of the semiconductor 33 to form the conductive layer 37, the adhesiveness between the source and drain electrodes 34 and 35 and the semiconductor 33 can be enhanced, whereby stable electrical characteristics can be obtained between the source and drain electrodes 34 and 35 and the semiconductor 33. Also, the formation of the conductive layer 37 advantageously ensures a satisfactory ohmic contact between the source electrode 34 etc. and the semiconductor 33.

The conductive layer 37 is removed from an upper surface portion of the channel portion 33c so that a removal portion 40 having a recessed upper surface is formed. If the conductive layer 37 is present at the channel portion 33c, conduction may be established between the source and drain electrodes 34 and 35, and therefore, the on/off control of the TFT 17 may not be appropriately performed. In contrast to this, by removing the conductive layer 37 from the channel portion 33c, the metal oxide semiconductor can appropriately exhibit its intended function, whereby the on/off control of the TFT 17 can be stably performed.

<First Contact Structure>

Figure 5:
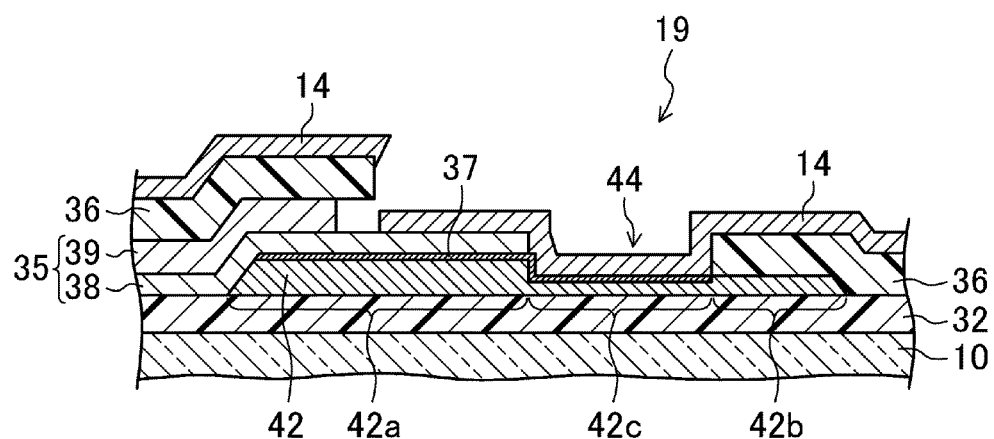
FIG. 5 is a cross-sectional view schematically showing a range indicated by an arrow B of FIG. 2.

FIG. 5 shows the first contact structure 19 at the connection portion between the TFT 17 and the pixel electrode 14. The first contact structure 19 is devised so that satisfactory electrical characteristics can be obtained between the drain electrode 35 of the TFT 17 formed below the protection film 36 and the pixel electrode 14 formed above the protection film 36, by utilizing the metal oxide semiconductor used in the semiconductor 33 of the TFT 17.

The first contact structure 19 includes the first terminal 42, the drain electrode 35 (first electrode) of the TFT 17, the protection film 36, the pixel electrode 14 (second electrode), etc., and is provided on the gate insulating film 32 formed on the base substrate 10 (the first contact structure 19 may be provided directly on the base substrate 10). The first contact structure 19 is provided in the vicinity of the gate line 12 in each transparent portion 13, partially overlapping the other end portion of the drain electrode 35.

The first terminal 42 is formed of the same metal oxide semiconductor (IGZO) as that of the semiconductor 33 of the TFT 17, and is formed on the gate insulating film 32 simultaneously with the semiconductor 33. The drain electrode 35 is connected to one end portion of the first terminal 42. In this embodiment, a tip of the Ti layer 38 of the drain electrode 35 protrudes from the Al layer 39. The protection film 36 is provided above the drain electrode 35 and the first terminal 42 so that the drain electrode 35 and the other end portion of the first terminal 42 are covered by the protection film 36. The upper surface of a middle portion of the first terminal 42 is exposed through the protection film 36 via a contact hole. A tip portion of the Ti layer 38 of the drain electrode 35 is also exposed through the protection film 36 via the contact hole.

Therefore, the first terminal 42 has a portion whose upper portion is in contact with the drain electrode 35, a portion which is covered by the protection film 36 and is in contact with the protection film 36, and a portion located between these two portions and whose upper surface is exposed through the drain electrode 35 and the protection film 36. These portions are referred to as a first connection portion 42a, a covered portion 42b, and a first exposed portion 42c, respectively, for the sake of convenience.

The conductive layer 37 is formed in an upper surface portion of the first terminal 42. Specifically, the conductive layer 37 is formed in upper surface portions of the first connection portion 42a and the first exposed portion 42c excluding the covered portion 42b. A recessed portion 44 having a lower surface is formed in the upper surface of the first terminal 42. The recessed portion is formed on the covered portion 42b side, i.e., on the covered portion 42b and the first exposed portion 42c.

The pixel electrode 14 is provided above the protection film 36 and the first terminal 42. The pixel electrode 14 is connected to the drain electrode 35 via the first terminal 42. The pixel electrode 14 is divided at a portion of the first contact structure 19. Specifically, the pixel electrode 14 is divided into two portions having different levels with an edge of the protection film 36 located above the first connection portion 42a being a boundary between the two portions.

In the drain electrode 35, an end surface of the Al layer (upper layer) 39 is further back than an end surface of the protection film 36. If the ITO which is a material for the pixel electrode 14 is in contact with the Al, galvanic corrosion occurs. Therefore, galvanic corrosion is reduced or prevented by the end surface of the Al layer 39 being set back at the edge of the protection film 36.

The conductive layer 37 having a small electrical resistance is formed in the upper surface portions of the first connection portion 42a and the first exposed portion 42c of the first terminal 42. Therefore, even when the first terminal 42 is formed of a metal oxide semiconductor, which is inherently non-conductive, the first terminal 42 functions as a terminal which electrically connects the drain electrode 35 and the pixel electrode 14 together. The first terminal 42 is in surface contact with each of the drain electrode 35 and the pixel electrode 14, whereby the contact area can be increased, resulting in satisfactory and stable electric al characteristics.

The first terminal 42 functions not only as a terminal but also as an etch stopper. For example, when the contact hole is formed in the protection film 36, etching is performed using a fluorine-based gas. When exposed to the fluorine-based gas, not only the protection film 36 but also the gate insulating film 32 are removed.

In contrast to this, the metal oxide semiconductor is resistant (high selectivity) to the etching action of the fluorine-based gas, and therefore, is not substantially removed. Therefore, in the first contact structure 19, by providing the first terminal 42 of IGZO in the region where the contact hole is to be formed, the removal of the gate insulating film 32 below the first terminal 42 is reduced or prevented.

The gate line 12 is provided in the vicinity of the first contact structure 19. Therefore, if the gate insulating film 32 is removed, so that the gate line 12 is exposed, then when the pixel electrode 14 is provided, a short circuit may be made between the gate line 12 and the pixel electrode 14. In contrast to this, in the first contact structure 19, the IGZO can reduce or prevent the action of the fluorine-based gas on the gate insulating film 32, and therefore, such a defect can be reduced or eliminated.

The first terminal 42 can be formed simultaneously with the semiconductor 33, advantageously resulting in higher productivity.

<Second Contact Structure>

Figure 6:
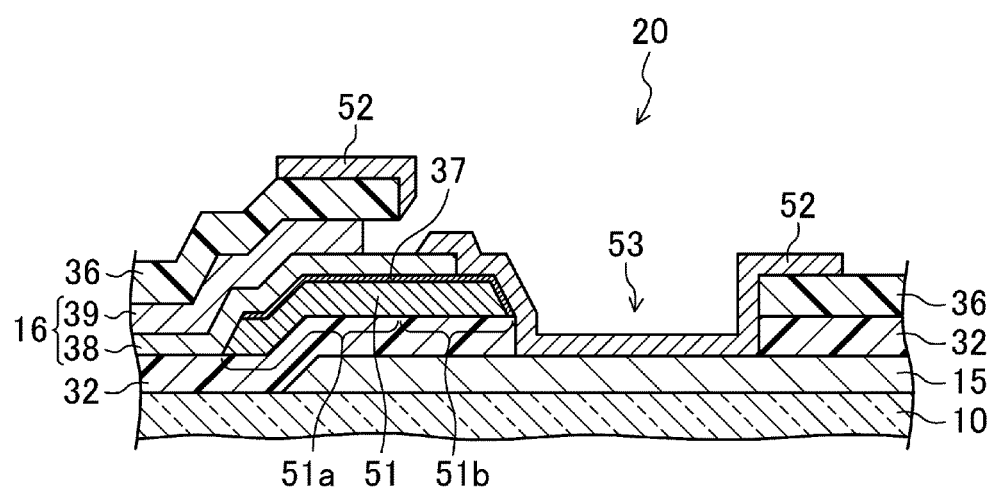
FIG. 6 is a cross-sectional view schematically showing a range indicated by an arrow C of FIG. 2.

FIG. 6 shows the second contact structure 20 at the connection portion between the auxiliary capacitor line 15 and the common line 16. The second contact structure 20 is also devised so that by utilizing the metal oxide semiconductor which is used as the semiconductor 33 of the TFT 17, satisfactory electrical characteristics can be obtained between the auxiliary capacitor line 15 formed below the gate insulating film 32 and the common line 16 formed above the gate insulating film 32.

The second contact structure 20 includes the auxiliary capacitor line 15 (auxiliary gate electrode), the gate insulating film 32, a second terminal 51, the common line 16 (third electrode), the protection film 36, a connection electrode 52, etc. The second contact structure 20 is provided on the base substrate 10.

The auxiliary capacitor line 15 is formed of the same material as that of the gate line 12, and is formed on the base substrate 10 by patterning simultaneously with the gate line 12. The gate insulating film 32 is provided on the auxiliary capacitor line 15. The auxiliary capacitor line 15 is covered by the gate insulating film 32.

The second terminal 51 is formed of the same metal oxide semiconductor (IGZO) as that of the semiconductor 33 and the first terminal 42, and is formed on the gate insulating film 32 simultaneously with the semiconductor 33 and the first terminal 42. In the second contact structure 20, the second terminal 51 is provided above an end portion of the auxiliary capacitor line 15 with the gate insulating film 32 being interposed between the second terminal 51 and the auxiliary capacitor line 15. The common line 16 is connected via the second terminal 51 to the connection electrode 52, and is also connected via the connection electrode 52 to the auxiliary capacitor line 15. The common line 16 is formed of the same material (Al/Ti) as that of the source line 11 etc., and is formed by patterning simultaneously with the source line 11 etc.

The common line 16 is connected to the upper surface of the second terminal 51. Also in this embodiment, a tip of the Ti layer 38 of the common line 16 protrudes from the Al layer 39. The protection film 36 is provided above the common line 16. The Al layer 39 and the second terminal 51 are partially covered by the protection film 36. By forming a contact hole, tip portions of the second terminal 51 and the Ti layer 38 are exposed through the protection film 36. Therefore, the second terminal 51 has a portion whose upper surface is in contact with the common line 16 and which is covered by the protection film 36, and a portion whose upper surface is exposed through or covered by the Ti layer 38 and which is exposed through the protection film 36. These portions are referred to as a third connection portion 51a and a second exposed portion 51b, respectively, for the sake of convenience.

Also in the second terminal 51, the conductive layer 37 is formed in an upper surface portion thereof. Specifically, the conductive layer 37 is formed in upper surface portions of the third connection portion 51a and the second exposed portion 51b. A portion (electrode exposed portion 53) where the upper surface of the auxiliary capacitor line 15 is exposed through the gate insulating film 32 is formed in the vicinity of the second exposed portion 51b by forming the contact hole.

The connection electrode 52 is disposed in contact with the upper surface of each of the second exposed portion 51b and the electrode exposed portion 53 of the second terminal 51. The connection electrode 52 is formed of the same ITO as that of the pixel electrode 14, and is formed by patterning simultaneously with the pixel electrode 14. In order to reduce or prevent galvanic corrosion from occurring between the connection electrode 52 and the Al layer 39 of the common line 16, an end surface of the Al layer (upper layer) 39 of the common line 16 is further back than an end surface of the protection film 36.

The conductive layer 37 which is conductive to allow current flow is formed in an upper surface portion of the second terminal 51. Therefore, the second terminal 51 functions as a terminal which electrically connects the common line 16 and the connection electrode 52 together. The second terminal 51 is in surface contact with the common line 16 and the connection electrode 52, whereby the contact area can be increased, resulting in satisfactory and stable electrical characteristics.

The second terminal 51 functions not only as a terminal but also as an etch stopper. Specifically, also in the second contact structure 20, the second terminal 51 of IGZO is provided in a portion of the region where the contact hole is to be formed, whereby the removal of the gate insulating film 32 below the second terminal 51 can be reduced or prevented.

On the other hand, the auxiliary capacitor line 15 is located below the other portion of the region where the contact hole is to be formed. The gate insulating film 32 at that portion is etched by a fluorine-based gas, and therefore, the upper surface of the auxiliary capacitor line 15 is exposed. Therefore, by forming a contact hole in a region including a portion of the second terminal 51 and a portion of the auxiliary capacitor line 15 using the fluorine-based gas, both the upper surfaces of the second terminal 51 and the auxiliary capacitor line 15 can be simultaneously exposed, whereby the connection of the connection electrode 52 can be established without an increase in the number of steps.

<Method for Manufacturing TFT Substrate>

Next, a method for manufacturing the TFT substrate 3 will be described with reference to a flowchart shown in FIG. 7.

The TFT 17, the first contact structure 19, and the second contact structure 20 are simultaneously manufactured by a series of steps of manufacturing the TFT substrate 3.

As shown in the flowchart, the method for manufacturing the TFT substrate 3 of this embodiment includes a gate line-and-the-like forming step (step S1) of forming the gate electrode 31 and the like, a gate insulating film forming step (step S2) of forming the gate insulating film 32, a semiconductor-and-the-like forming step (step S3) of forming the semiconductor 33 and the like, a source line-and-the-like forming step (step S4) of forming the source electrode 34 and the like, a conductive layer removing step (step S5) of removing the conductive layer 37 of the channel portion 33c, a protection film forming step (step S6) of forming the protection film 36, a contact hole forming step (step S7) of forming the contact hole, an Al layer removing step (step S8) of setting back the Al layer 39 of the source electrode 34 and the like, a pixel electrode-and-the-like forming step (step S9) of forming the pixel electrode 14 and the like, etc.

Figure 8:
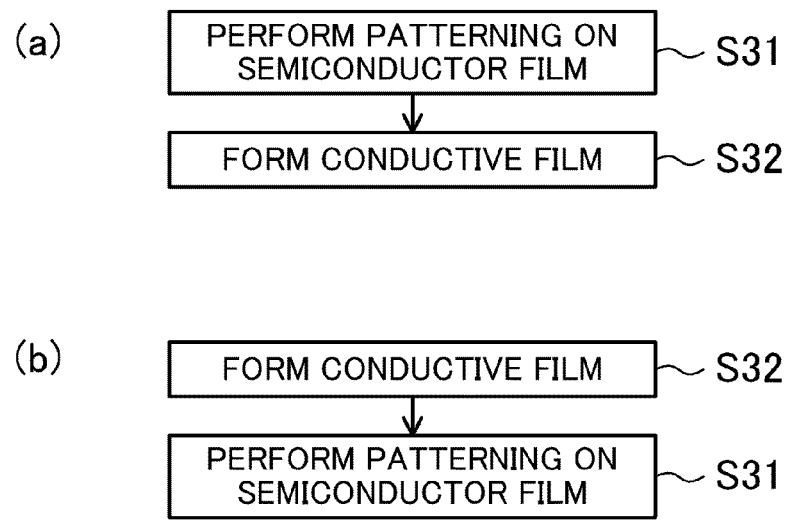
FIG. 8 is a flowchart showing a semiconductor-and-the-like forming step.

Thereafter, as shown in FIG. 8, the semiconductor-and-the-like forming step includes a semiconductor patterning step (step S31) of performing patterning on a semiconductor film, and a conductive layer forming step (step S32) of forming the conductive layer 37.

Figure 9:
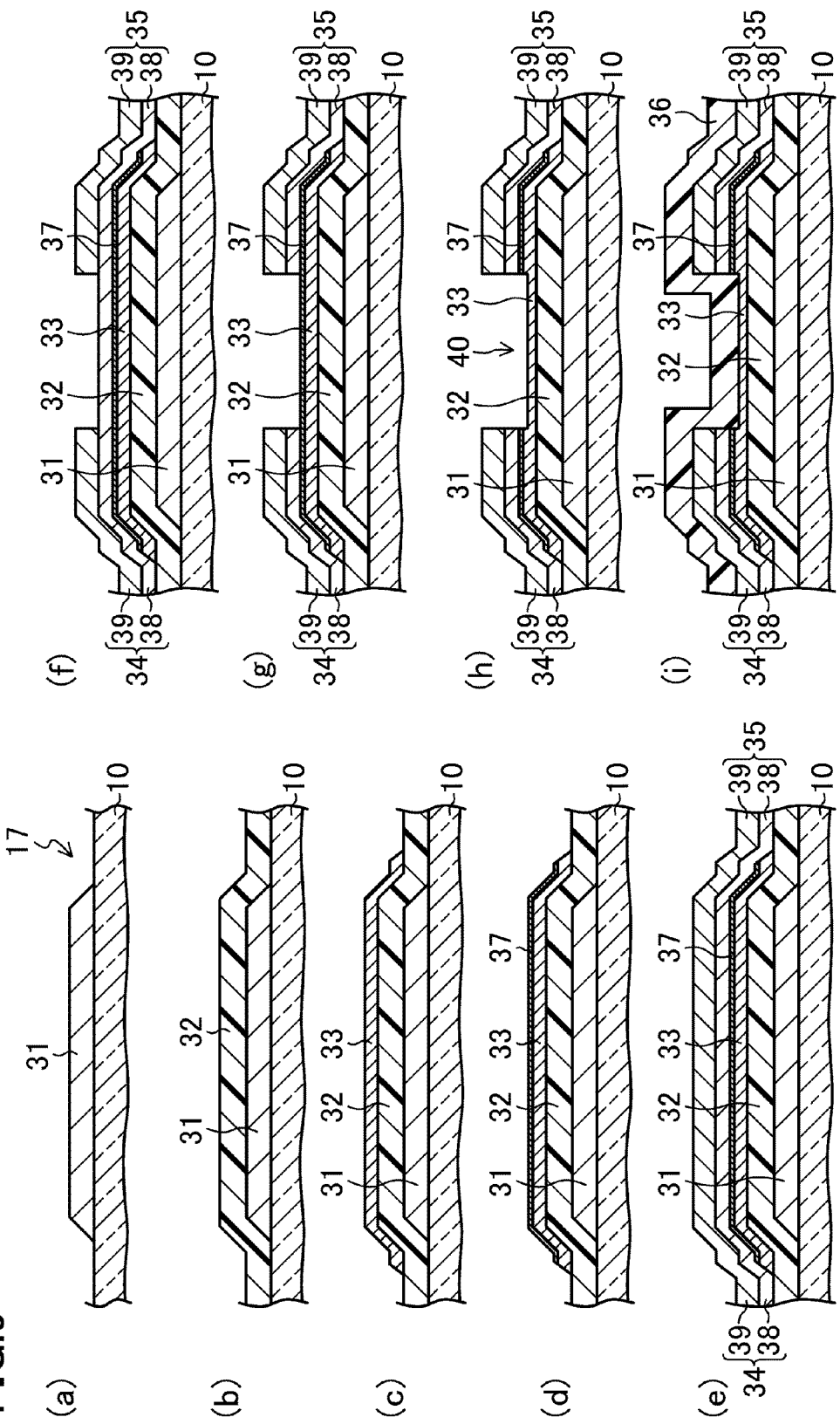
FIGS. 9(a)-9(i) are cross-sectional views schematically showing a process of forming a TFT.
Figure 10:
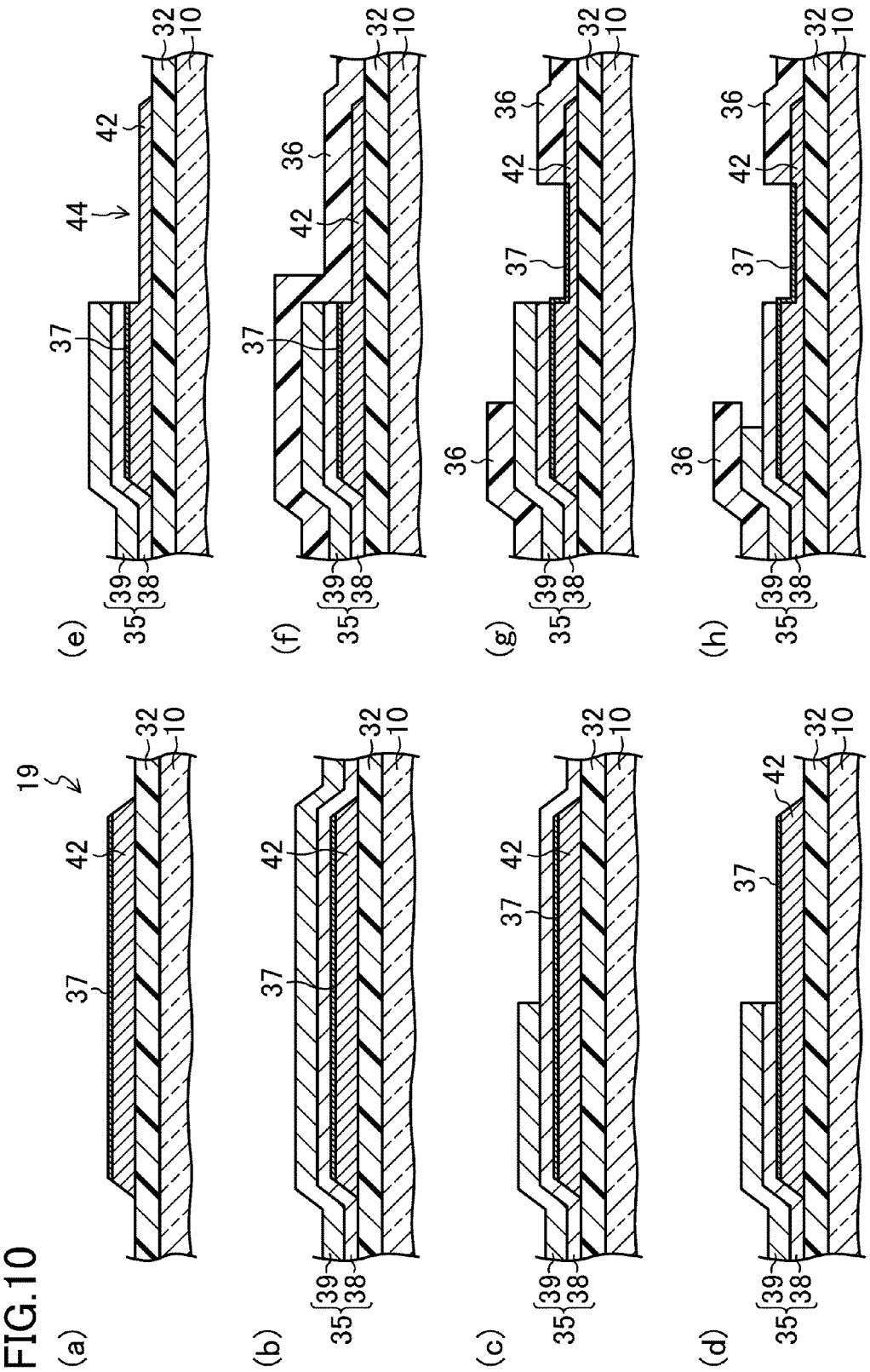
FIGS. 10(a)-10(h) are cross-sectional views schematically showing a process of forming a first contact structure.
Figure 11:
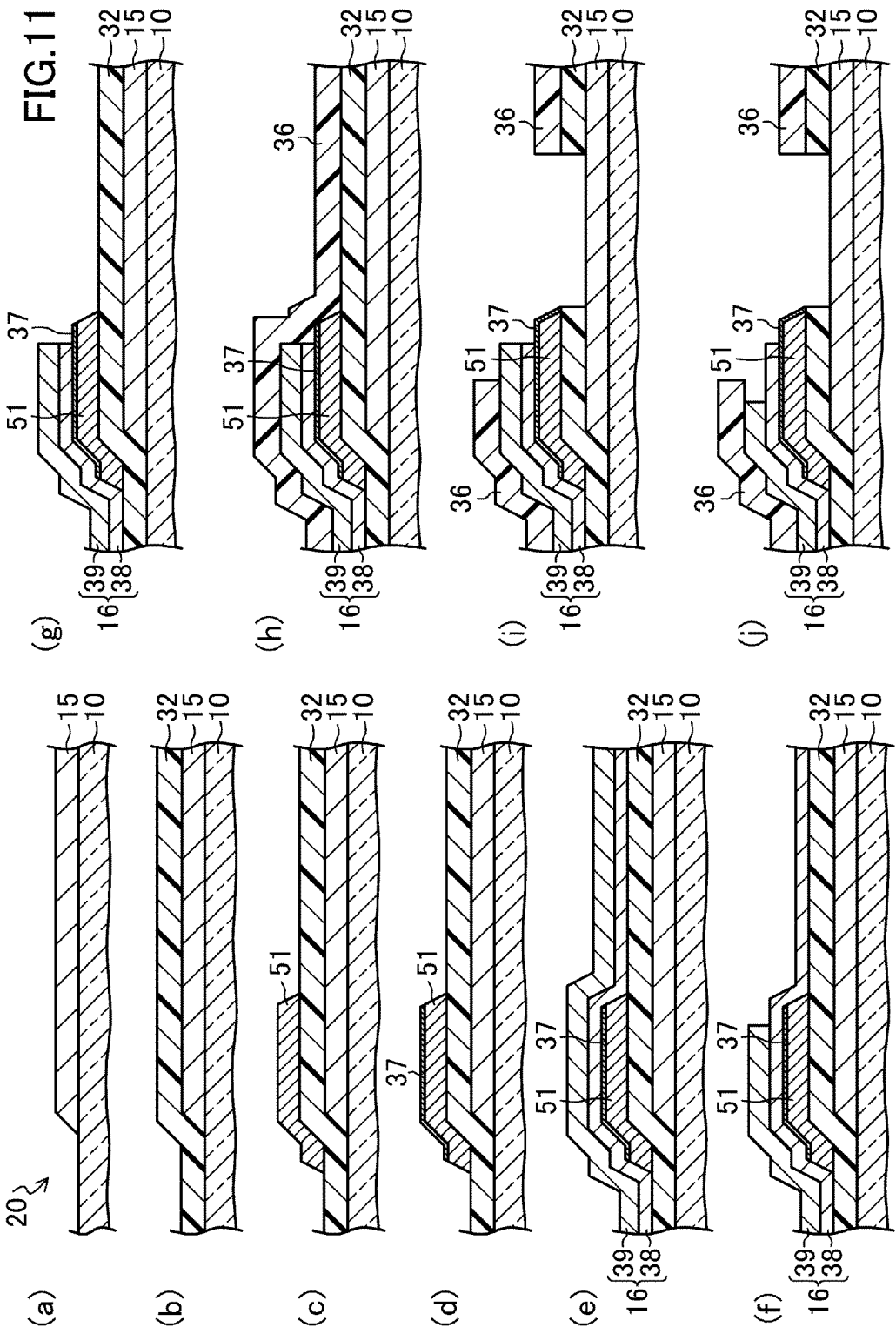
FIGS. 11(a)-11(j) are cross-sectional views schematically showing a process of forming a second contact structure.

Of these steps, the TFT 17 can be manufactured by steps S1-S6. The first and second contact structures 19 and 20 are formed by steps S1-S9. A process of forming the TFT 17 corresponding to these steps is shown in FIG. 9. Similarly, a process of forming the first contact structure 19 is shown in FIG. 10, and a process of forming the second contact structure 20 is shown in FIG. 11.

(Gate Line-and-the-Like Forming Step)

In this step, the gate line 12, the gate electrode 31, and the auxiliary capacitor line 15 are formed by forming a film of a conductive material on the base substrate 10 and performing patterning on the film. For example, a conductive metal film having a predetermined thickness is formed on the entire upper surface of the base substrate 10 by sputtering. Next, patterning is performed by a photoresist process. Specifically, a photosensitive resin film (photoresist) is applied to the entire metal film by spin coating. Thereafter, patterning is performed on the photoresist using a photomask to form a predetermined resist pattern.

Figure 12:
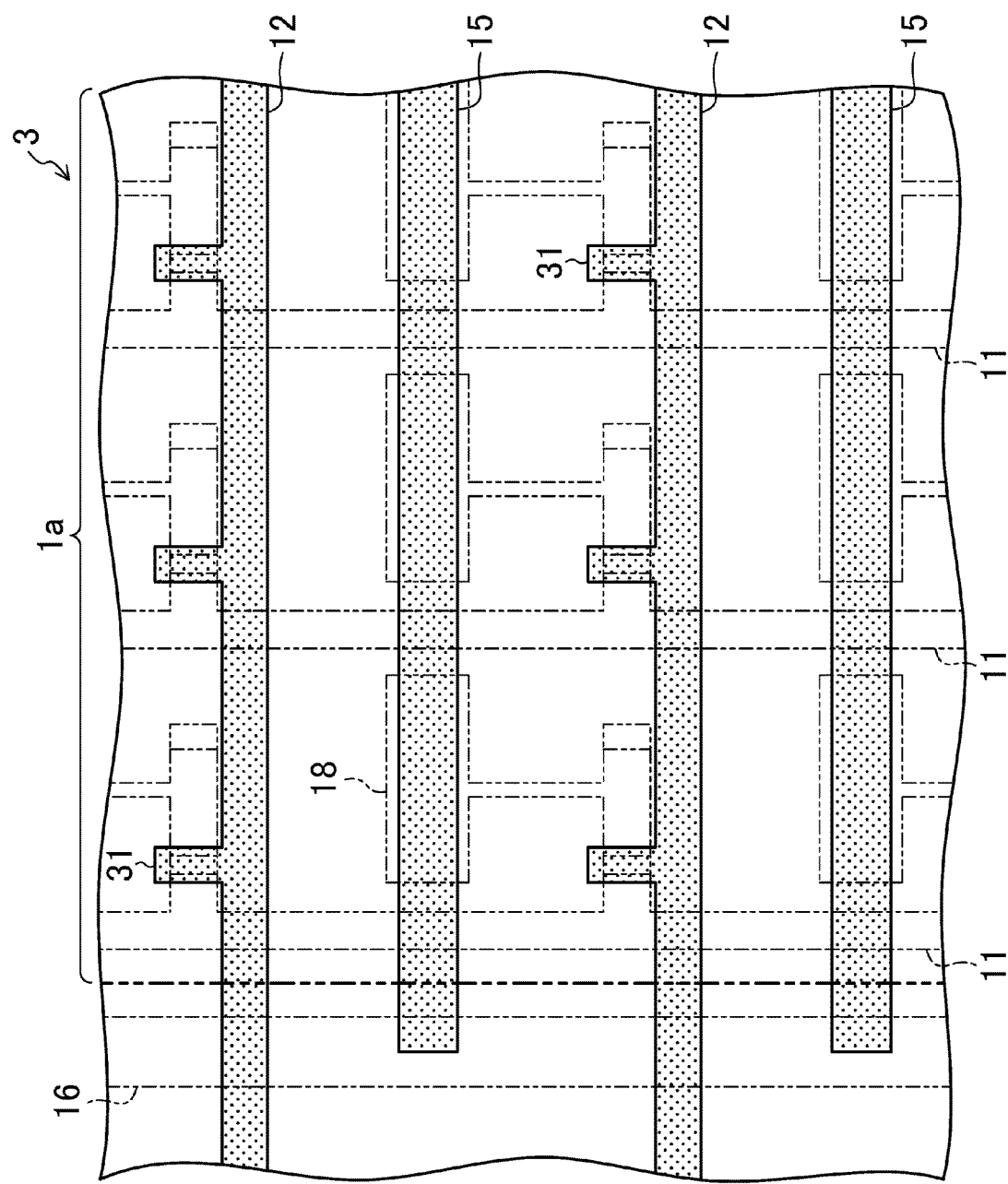
FIG. 12 is a plan view schematically showing a process of forming the TFT substrate.

Thereafter, a portion of the metal film which is exposed through the resist pattern is removed by wet etching. Next, the resist pattern which is no longer required is removed. As a result, the gate line 12, the gate electrode 31, and the auxiliary capacitor line 15 having a predetermined pattern (indicated by dots) shown in FIG. 12 are formed on the base substrate 10. Note that, in this embodiment, these processes are repeatedly performed to form the gate line 12 etc. having a multilayer (three-layer) structure.

The TFT 17 and the second contact structure 20 after this step are shown in FIGS. 9(a) and 11(a), respectively.

(Gate Insulating Film Forming Step)

In this step, the gate insulating film 32 covering the gate line 12, the gate electrode 31, and the auxiliary capacitor line 15 is formed by forming a film of a predetermined insulating material. For example, the gate insulating film 32 is formed by forming a silicon oxide film on the entire upper surface of the base substrate 10 on which the gate electrode 31 etc. have been formed, by plasma-enhanced chemical vapor deposition (CVD) using $SiH_4$—$N_2O$ or tetraethoxysilane (TEOS) as a material gas. The TFT 17 and the second contact structure 20 after this step are shown in FIGS. 9(b) and 11(b), respectively.

(Semiconductor-and-the-Like Forming Step)

In this step, a semiconductor patterning step and a conductive layer forming step are performed. As shown in FIGS. 8(*a*) and 8(*b*), the conductive layer forming step may be performed either before or after the semiconductor patterning step. Here, the conductive layer forming step is assumed to be performed after the semiconductor patterning step.

(Semiconductor Patterning Step)

In this step, the semiconductor 33, the first terminal 42, and the second terminal 51 are formed in a manner similar to the gate line-and-the-like forming step. Specifically, a metal oxide semiconductor film of IGZO (IGZO film) having a predetermined thickness is formed by sputtering on the entire upper surface of the base substrate 10 on which the gate insulating film 32 has been formed. Other application techniques may be employed instead of sputtering. Next, a photoresist is applied on the entire IGZO film by spin coating.

Figure 13:
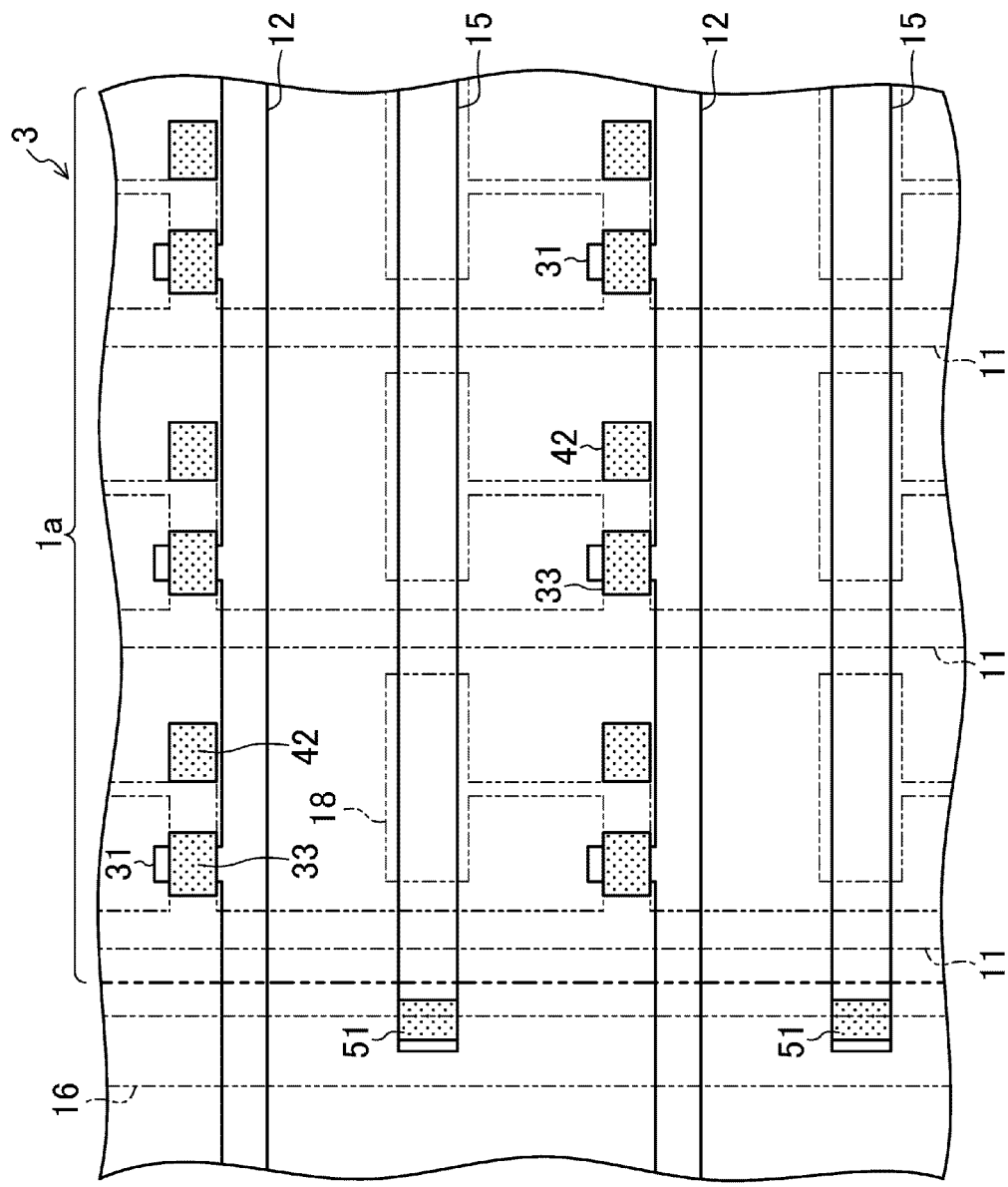
FIG. 13 is a plan view schematically showing a process of forming the TFT substrate.

Thereafter, patterning is performed on the photoresist using a photomask to form a predetermined resist pattern. Thereafter, a portion of the IGZO film which is exposed through the resist pattern is removed by wet etching using oxalic acid etc. Next, the resist pattern which is no longer required is removed. As a result, the semiconductor 33 etc. having a predetermined pattern (indicated by dots) shown in FIG. 13 is formed. The TFT 17 and the second contact structure 20 after this step are shown in FIGS. 9(*c*) and 11(*c*), respectively.

(Conductive Layer Forming Step)

In this step, the upper surfaces of the semiconductor 33 etc. thus formed are exposed to plasma containing at least one element of fluorine, hydrogen, and boron, to form the conductive layer 37 in the upper surface portions of the semiconductor 33 etc. For example, the upper surface of the base substrate 10 on which the semiconductor 33 etc. have been formed is exposed to plasma atmosphere for a predetermined time by CVD, doping, etc. As a result, the exposed surface portions of the semiconductor 33 etc. are altered to form the conductive layer 37.

In this step, at least one of fluorine and boron is particularly preferably employed as the element contained in the plasma. This is because annealing and washing are typically performed after the formation of the conductive layer 37, and if fluorine or boron is employed, the resistance value is not significantly changed irrespective of the annealing and cleaning performed after the formation of the conductive layer 37, and therefore, the stable conductive layer 37 can be formed.

Figure 14:
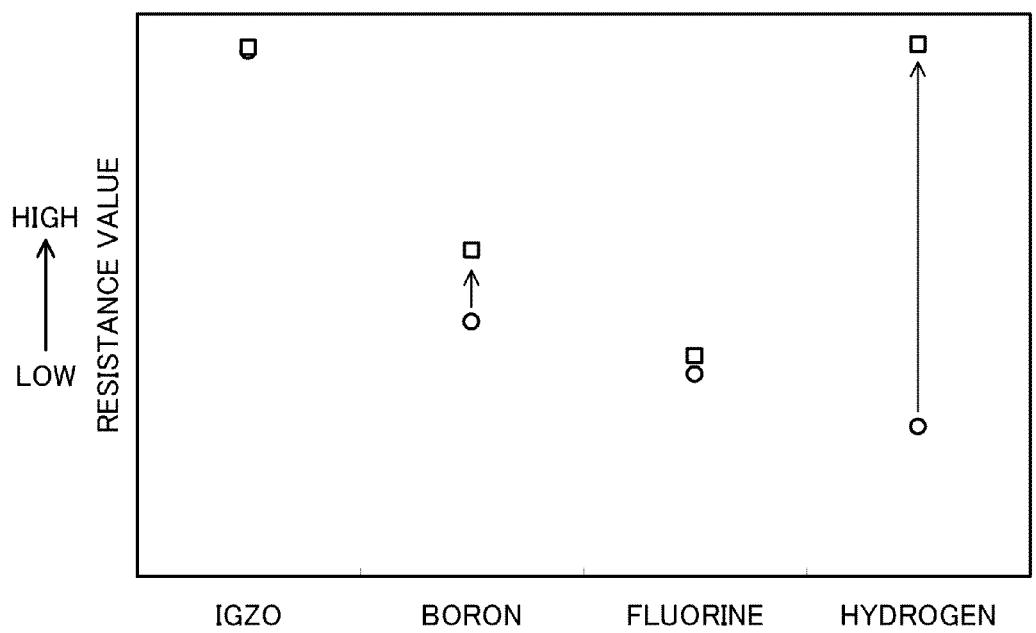
FIG. 14 is a diagram showing changes in resistance value caused by annealing.

FIG. 14 shows changes in resistance value which occur when annealing (350° C., 1 hour) and washing are performed after performing a plasma treatment containing fluorine, boron, or hydrogen on IGZO. In FIG. 14, circles indicate the resistance values before annealing etc., and squares indicate the resistance values after annealing etc. On the horizontal axis, "IGZO" indicates a comparative control on which a plasma treatment was not performed, and "boron," "fluorine," and "hydrogen" indicate test results of a plasma treatment using the respective elements.

As shown in FIG. 14, the resistance value of IGZO decreases due to a plasma treatment containing boron, fluorine, or hydrogen. Thereafter, if annealing etc. are performed, the resistance value does not significantly change and is stable for boron and fluorine. However, for hydrogen, the resistance value significantly changes and becomes high, i.e., the resistance value is restored.

Therefore, if the conductive layer 37 is formed using boron or fluorine, the conductive layer 37 becomes stable, and therefore, the high-quality TFT 17, contact structure, etc. having better electrical characteristics can be obtained.

The TFT 17, the first contact structure 19, and the second contact structure 20 after this step are shown in FIGS. 9(*d*), 10(*a*), and 11(*d*), respectively.

(Source Line-and-the-Like Forming Step)

In this step, the source line 11, the source electrode 34, the drain electrode 35, and the common line 16 are formed by forming a film of a predetermined conductive material and performing patterning on the film. Specifically, for example, a conductive metal film having a predetermined thickness is formed by sputtering on the entire upper surface of the base substrate 10 on which the semiconductor 33 etc. have been formed. In this embodiment, initially, the Ti layer (lower layer) 38 of Ti is formed (e.g., 30 nm thick). Thereafter, the Al layer (upper layer) 39 of Al (e.g., 200 nm thick) is formed on the Ti layer 38. The TFT 17, the first contact structure 19, and the second contact structure 20 after this step are shown in FIGS. 9(*e*), 10(*b*), and 11(*e*), respectively.

Next, patterning is performed on the Al layer 39, but not on the Ti layer 38, by a photoresist process (Al layer patterning step). Specifically, a photoresist is applied to the entire metal film by spin coating. Thereafter, patterning is performed on the photoresist using a photomask to form a predetermined resist pattern.

Thereafter, a portion of the Al layer 39 which is exposed through the resist pattern is removed by wet etching using, for example, a mixture solution of acetic acid, phosphoric acid, or nitric acid, etc. In this case, if the IGZO is exposed, the IGZO is also etched. In this embodiment, the IGZO is covered and protected by the Ti layer 38. The TFT 17, the first contact structure 19, and the second contact structure 20 after this step are shown in FIGS. 9(*f*), 10(*c*), and 11(*f*), respectively.

Figure 15:
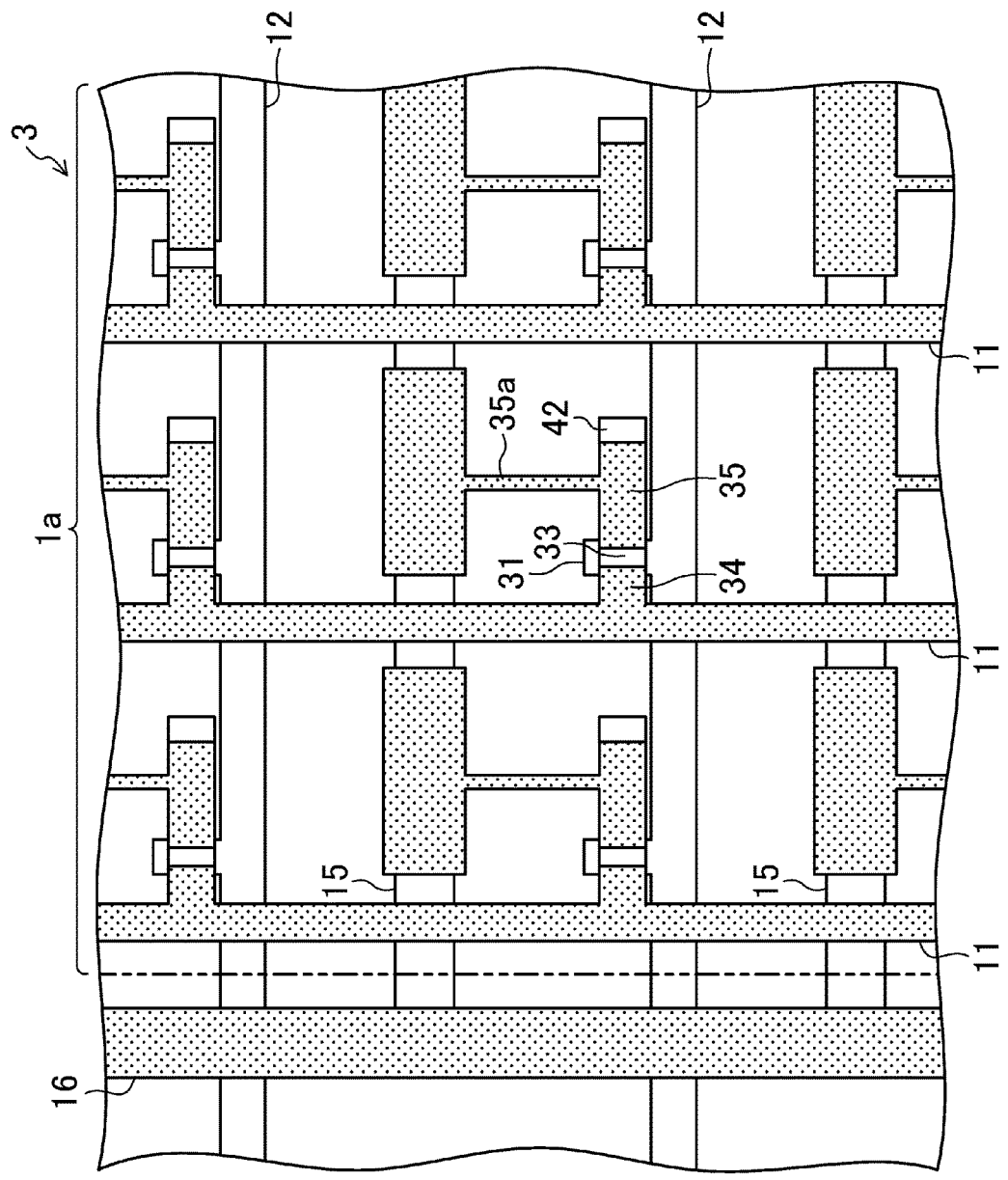
FIG. 15 is a plan view schematically showing a process of forming the TFT substrate.

Next, patterning is performed on the Ti layer 38 by dry etching using a chloride gas or a fluorine gas (Ti layer patterning step). Thereafter, the resist pattern which is no longer required is removed. After this step, the source line 11, the source electrode 34, the drain electrode 35, and the common line 16, etc. having a predetermined pattern (indicated by dots) shown in FIG. 15 are formed. The TFT 17, the first contact structure 19, and the second contact structure 20 thus formed are shown in FIGS. 9(*g*), 10(*d*), and 11(*g*), respectively.

(Conductive Layer Removing Step)

In this step, the conductive layer 37 of the channel portion 33*c* is removed from the semiconductor 33 by dry etching using a photoresist process. Specifically, a photoresist is applied by spin coating, and thereafter, patterning is performed on the photoresist using a photomask, to form a predetermined resist pattern. Thereafter, a portion of the channel portion 33*c* exposed through the resist pattern is removed by dry etching using a chloride gas.

When chloride gas is used in the Ti layer patterning step, the conductive layer 37 can be removed successively in the same step. Therefore, in this case, this step may be removed. After this step, in the TFT 17, a portion of the conductive layer 37 is removed to form the removal portion 40 (the resulting TFT 17 is shown in FIG. 9(*h*)), and in the first contact structure 19, a portion of the conductive layer 37 is removed to form the recessed portion 44 (the resulting first contact structure 19 is shown in FIG. 10(*e*)).

(Protection Film Forming Step)

In this step, the protection film 36 covering the source line 11, the source electrode 34, the drain electrode 35, and the common line 16 is formed by forming a film of a predetermined insulating material. Specifically, as with the gate insulating film 32, the protection film 36 is formed by forming a silicon oxide film is formed on the entire upper surface of the base substrate 10 by plasma-enhanced CVD using SiH$_4$—N$_2$O or TEOS as a material gas. The TFT 17, the first contact structure 19, and the second contact structure 20 after this step are shown in FIGS. 9(*i*), 10(*f*), and 11(*h*), respectively.

(Contact Hole Forming Step)

In this step, the protection film 36 is etched using, for example, a gas containing fluorine (fluorine-based gas), such as CF4 or SF6, etc., whereby the upper surfaces of the first exposed portion 42*c*, the second exposed portion 51*b*, and the electrode exposed portion 53 are exposed. Specifically, a photoresist is applied by spin coating, and thereafter, patterning is performed on the photoresist using a photomask, to form a predetermined resist pattern. Thereafter, portions of the first and second exposed portions 42*c* and 51*b* exposed through the resist pattern are removed by dry etching using the fluorine-based gas to form the contact hole.

In this case, while the protection film 36 and the gate insulating film 32, which have low selectivity, are etched, the Al layer 39 and the semiconductor 33 etc., which are resistant to the fluorine-based gas (high selectivity), are not substantially etched. Thereafter, in the first contact structure 19, a surface portion of the recessed portion of the first terminal 42 at the portion exposed through the resist pattern is exposed to the fluorine-containing gas, so that the conductive layer 37 is formed again. Therefore, contact structures having different aspect ratios can be easily formed. The first and second contact structures 19 and 20 after this step are shown in 10(*g*) and 11(*i*), respectively.

(Al Layer Removing Step)

In this step, an end portion of the Al layer 39 along the contact hole is etched so that the end portion of the Al layer 39 is further back than (set back from) an end portion of the protection film 36. Specifically, for example, etching is performed using an alkaline solution of tetramethyl ammonium hydroxide (TMAH) etc. Although acidic solution may be used to etch the Al layer 39, IGZO is also disadvantageously etched by the acidic solution. The first and second contact structures 19 and 20 after this step are shown in 10(*h*) and 11(*j*), respectively.

(Pixel Electrode-and-the-Like Forming Step)

In this step, the pixel electrode 14 and the connection electrode 52 are formed by forming a film of a predetermined conductive material film and performing patterning on the film. Specifically, an ITO film having a predetermined thickness may be formed by sputtering etc. on the entire upper surface of the base substrate 10 after the Al layer removing step, and thereafter, patterning may be performed by a photoresist process. As a result, the TFT 17, the first contact structure 19, and the second contact structure 20 shown in FIG. 3 etc. are formed.

Second Embodiment

This embodiment is different from the first embodiment in that the source electrode 34 etc. are not formed of Al, which is resistant (high selectivity) to fluorine-based gas, and are formed only of another material(s) (metal having a high melting point) which is not resistant (low selectivity) to fluorine-based gas, such as Ti etc. In the description that follows, components different from those of the first embodiment will be described in detail, and components similar to those of the first embodiment are indicated by the same reference characters and will not be described.

<TFT>

Figure 16:
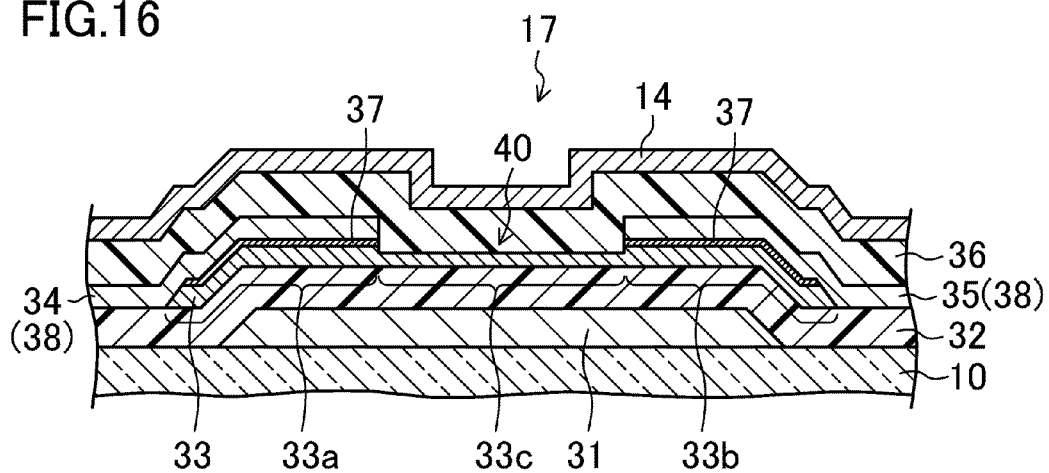
FIG. 16 is a diagram of a second embodiment corresponding to FIG. 3.

FIG. 16 shows a TFT 17 of this embodiment. As shown in FIG. 16, a source electrode 34 and a drain electrode 35 of the TFT 17 are formed only of Ti (i.e., a Ti layer 38). Instead of Ti, other metals, such as tungsten (W), molybdenum (Mo), tantalum (Ta), etc., may be employed.

<First Contact Structure>

Figure 17:
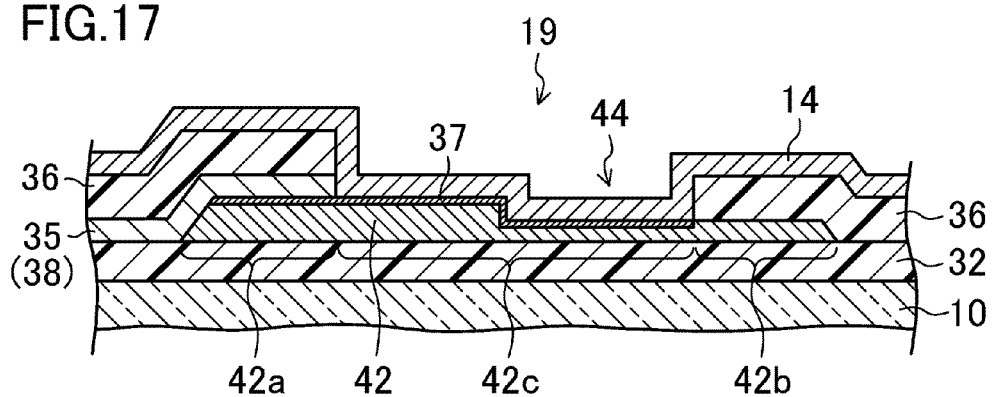
FIG. 17 is a diagram of the second embodiment corresponding to FIG. 5.

FIG. 17 shows a first contact structure 19 of this embodiment. As shown in FIG. 17, in a first terminal 42 of the first contact structure 19, end surfaces of the drain electrode 35 (the Ti layer 38) and a protection film 36 along the contact hole are on the same plane, and the Ti layer 38 is not formed in a portion which is exposed through the protection film 36 by formation of a contact hole. In other words, a first connection portion 42*a* is covered by the protection film 36, and most of a portion exposed through the protection film 36 is a first exposed portion 42*c*, with which a pixel electrode 14 is in contact. Because an Al layer 39 which is set back is not provided, the pixel electrode 14 is not divided at the contact hole and is continuously and integrally formed.

<Second Contact Structure>

Figure 18:
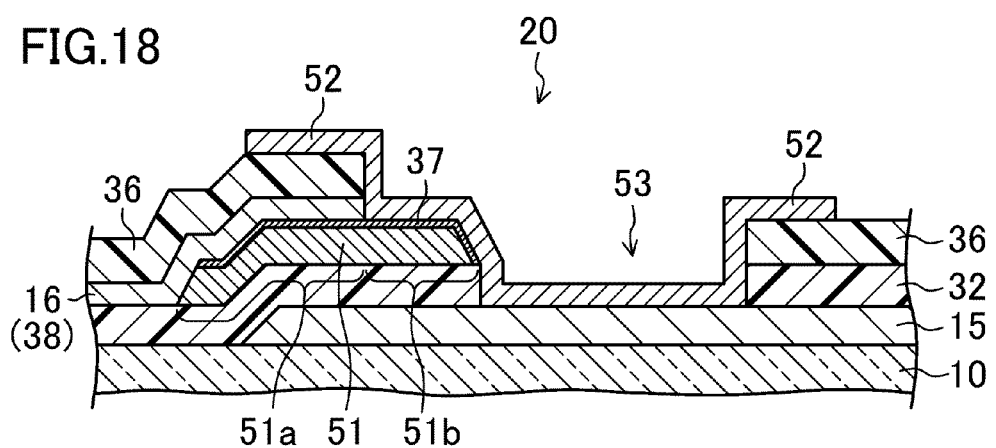
FIG. 18 is a diagram of the second embodiment corresponding to FIG. 6.

FIG. 18 shows a second contact structure 20 of this embodiment. As shown in FIG. 18, at a second terminal 51 of the second contact structure 20, similar to the first terminal 42, end surfaces of a drain electrode 35 (the Ti layer 38) and a protection film 36 along a contact hole are on the same plane, and the Ti layer 38 is not formed in a portion which is exposed through a protection film 36 by formation of a contact hole. Therefore, at a second exposed portion 51*b*, the upper surface of the second terminal 51 is exposed, and a connection electrode 52 is in contact with the upper surface of the second terminal 51. As in the first contact structure 19, the connection electrode 52 is not divided at the contact hole and is continuously and integrally formed.

<Method for Manufacturing TFT Substrate>

Next, a method for manufacturing the TFT substrate of this embodiment will be described.

Figure 7:
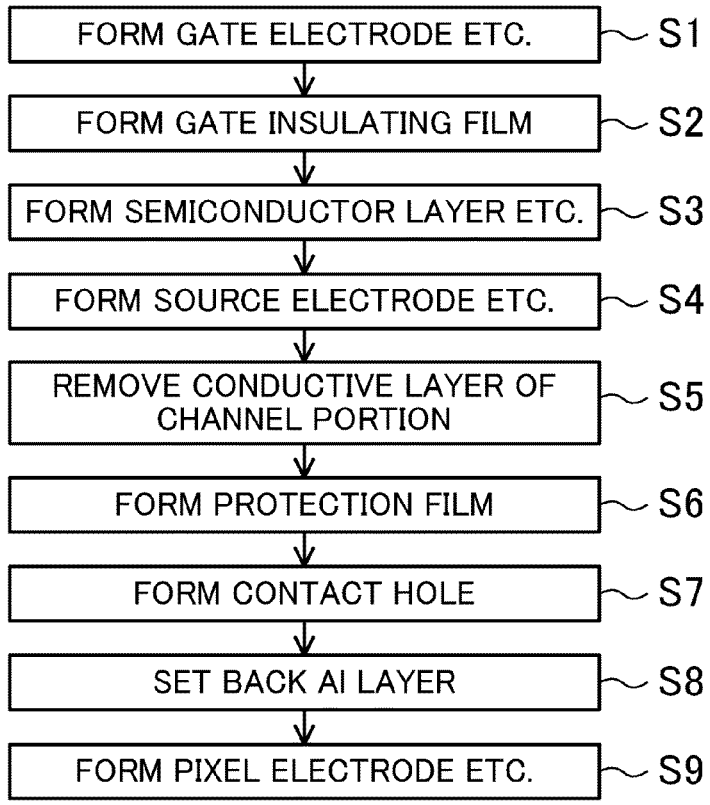
FIG. 7 is a flowchart showing steps of manufacturing the TFT substrate.

As shown in FIG. 7, similar to the first embodiment, the method for manufacturing the TFT substrate of this embodiment includes a gate line-and-the-like forming step (step S1), a gate insulating film forming step (step S2), a semiconductor-and-the-like forming step (step S3), a conductive layer removing step (step S5), a protection film forming step (step S6), a contact hole forming step (step S7), a pixel electrode-and-the-like forming step (step S9), etc. The semiconductor-and-the-like forming step includes a semiconductor patterning step (step S31) and a conductive layer forming step (step S32).

Note that, in the manufacturing method of this embodiment, of the steps of FIG. 7, only the Ti layer 38 is formed in the source line-and-the-like forming step (step S4), and the Al layer 39 is not provided, and therefore, the step of removing the Al layer 39 (step S8) is not included.

Figure 20:
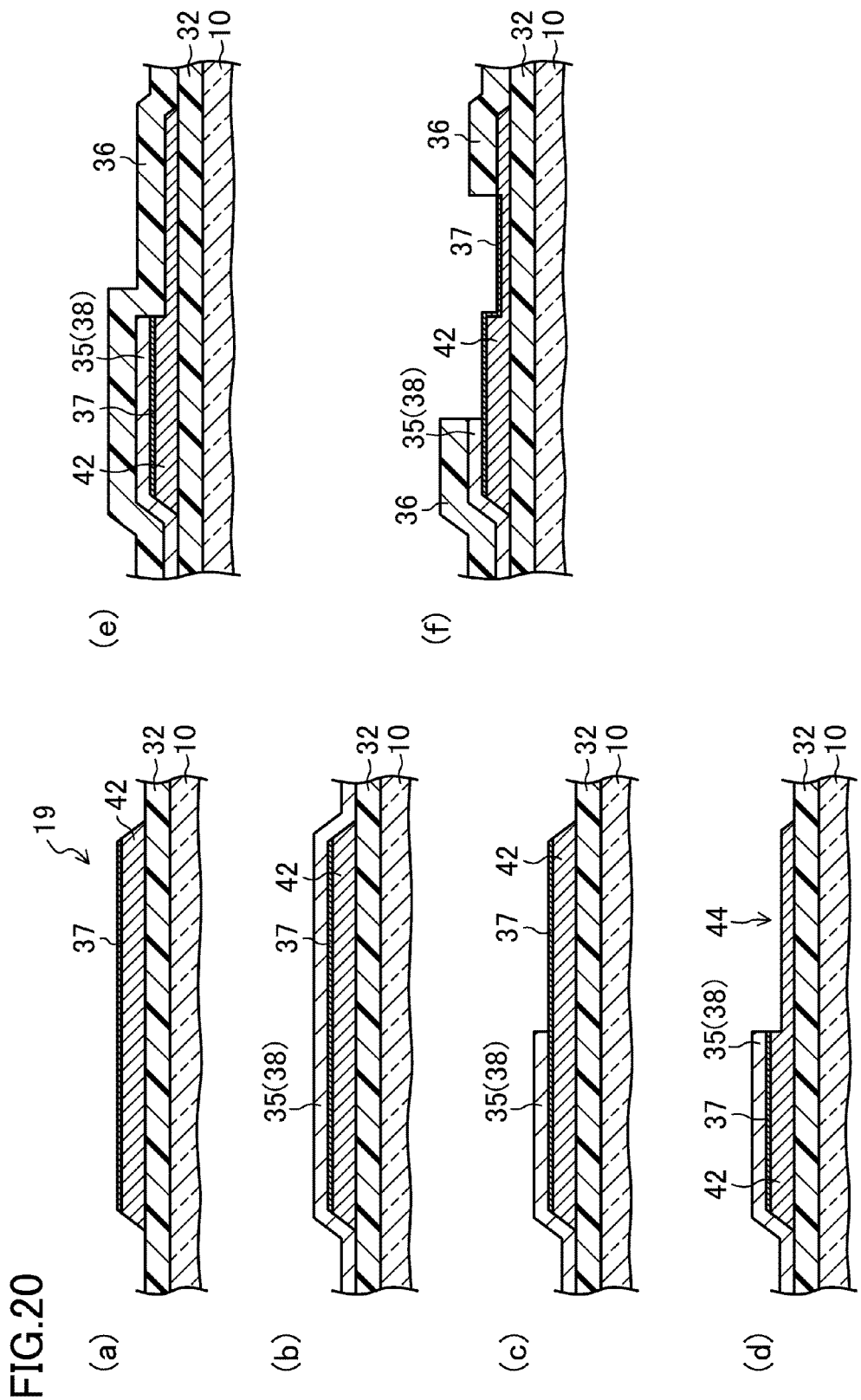
FIGS. 20(a)-20(f) are cross-sectional views schematically showing a process of forming a first contact structure of the second embodiment.

Of these steps, the TFT 17 can be manufactured by steps S1-S6. The first and second contact structures 19 and 20 are formed by steps S1-S9. A process of forming the TFT 17 corresponding to these steps is shown in FIG. 19. A process of forming the first contact structure 19 is shown in FIG. 20. A process of forming the second contact structure 20 is shown in FIG. 21.

(Gate Line-and-the-Like Forming Step etc.)

The states of the TFT 17 etc. in the gate line-and-the-like forming step, the gate insulating film forming step, and the semiconductor-and-the-like forming step are similar to those of the first embodiment. Specifically, the TFT 17 and the second contact structure 20 after the gate line-and-the-like forming step are shown in FIGS. 19(*a*) and 21(*a*), respectively. The TFT 17 and the second contact structure 20 after the gate insulating film forming step are shown in FIGS. 19(*b*) and 21(*b*), respectively. The TFT 17 and the second contact structure 20 after the semiconductor patterning step are shown in FIGS. 19(c) and 21(c), respectively. The TFT 17, the first contact structure 19, and the second contact structure 20 after the conductive layer forming step are shown in FIGS. 19(d), 20(a), and 21(d), respectively.

(Source Line-and-the-Like Forming Step)

In this step, the source line 11 etc. only of the Ti layer 38 are formed. Because the Al layer 39 does not need to be formed, the number of steps can be advantageously reduced. Specifically, for example, a Ti film having a predetermined thickness is formed by sputtering on the entire upper surface of the base substrate 10 on which the semiconductor 33 etc. have been formed. The TFT 17, the first contact structure 19, and the second contact structure 20 after this step are shown in FIGS. 19(e), 20(b), and 21(e), respectively.

Next, patterning is performed on the Ti film by dry etching using a chloride gas or a fluorine gas (Ti layer patterning step). Thereafter, the resist pattern which is no longer required is removed. The TFT 17, the first contact structure 19, and the second contact structure 20 after this step are shown in FIGS. 19(f), 20(c), and 21(f), respectively.

(Conductive Layer Removing Step)

As in the first embodiment, in this step, dry etching is performed using a photoresist process to remove the conductive layer 37 of the channel portion 33c from the semiconductor 33. The TFT 17 and the first contact structure 19 after this step are shown in FIGS. 19(g) and 20(d), respectively.

(Protection Film Forming Step)

In this step, a process similar to that of the first embodiment is performed. The TFT 17, the first contact structure 19, and the second contact structure 20 after this step are shown in FIGS. 19(h), 20(e), and 21(g), respectively.

(Contact Hole Forming Step)

In this step, the protection film 36 is etched using a fluorine-containing gas to form the contact hole so that the upper surfaces of the first exposed portion 42c, the second exposed portion 51b, and the electrode exposed portion 53 are exposed.

In this case, the first and second terminals 42 and 51 function as an etch stopper better than those of the first embodiment. Specifically, in this embodiment, Ti receives a severe etching action by the fluorine-based gas unlike Al. Therefore, the drain electrode 35 and the common line 16 along the portion where the contact hole is formed are removed, and therefore, because only the drain electrode 35 etc. are present, it is difficult to establish connection to the pixel electrode 14 and the connection electrode 52 which are subsequently formed, likely leading to a short circuit.

In contrast to this, IGZO is resistant to the fluorine-based gas, and therefore, if the first terminal 42 etc. are provided along the portion where the contact hole is to be formed, the etching action can be reduced or prevented by the first terminal 42 etc. (etch stopper). In addition, upper surface portions of the first terminal 42 etc. are reduced by an action by the fluorine-based gas, and therefore, a new conductive layer 37 is formed or the conductive layer 37 is enhanced. Therefore, the conductivity is improved, and therefore, satisfactory electrical characteristics can be obtained between the pixel electrode 14 etc. and the drain electrode 35 etc. which are subsequently formed.

Moreover, if the auxiliary capacitor line 15 is provided at the portion where the contact hole is to be formed, the upper surface of the auxiliary capacitor line 15 can be simultaneously exposed, whereby the step can be simplified.

The first contact structure 19 and the second contact structure 20 after this step are shown in FIGS. 20(f) and 21(h), respectively.

(Pixel Electrode-and-the-Like Forming Step)

This step is also performed in a manner similar to that of the first embodiment. The TFT 17, the first contact structure 19, and the second contact structure 20 after this step are shown in FIG. 16 etc.

INDUSTRIAL APPLICABILITY

The thin film transistor etc. of the present invention are applicable to displays for PCs and TVs, camcorders, digital cameras, navigation systems, audio reproduction devices (car audios, shelf stereos, etc.), game devices, portable information terminals (mobile computers, mobile telephones, handheld game devices, or electronic dictionaries, etc.), and the like.

DESCRIPTION OF REFERENCE CHARACTERS

1 PANEL
1a DISPLAY REGION
3 TFT SUBSTRATE
10 BASE SUBSTRATE
11 SOURCE LINE
12 GATE LINE
13 TRANSPARENT PORTION
14 PIXEL ELECTRODE
15 AUXILIARY CAPACITOR LINE
16 COMMON LINE
17 TFT
19 FIRST CONTACT STRUCTURE
20 SECOND CONTACT STRUCTURE
31 GATE ELECTRODE
32 GATE INSULATING FILM
33 SEMICONDUCTOR
33a SOURCE PORTION
33b DRAIN PORTION
33c CHANNEL PORTION
34 SOURCE ELECTRODE
35 DRAIN ELECTRODE
36 PROTECTION FILM
37 CONDUCTIVE LAYER
38 Ti LAYER
39 Al LAYER
40 REMOVAL PORTION
42 FIRST TERMINAL
42a FIRST CONNECTION PORTION
42b COVERED PORTION
42c FIRST EXPOSED PORTION
44 RECESSED PORTION
51 SECOND TERMINAL
51a THIRD CONNECTION PORTION
51b SECOND EXPOSED PORTION
52 CONNECTION ELECTRODE
53 ELECTRODE EXPOSED PORTION

The invention claimed is:

1. A contact structure provided on a substrate, comprising:
a gate line;
a gate insulating film covering the gate line;
a first terminal provided on the gate insulating film in the vicinity of the gate line;
a first electrode connected to the first terminal;
a protection film covering the first terminal and the first electrode; and
a second electrode provided on the protection film and connected to the first electrode via the first terminal, wherein
the first terminal includes a metal oxide semiconductor,
the first terminal has a first connection portion having an upper surface in contact with the first electrode, a covered portion in contact with the protection film at an upper surface spaced apart from the first electrode, and a first exposed portion having an upper surface exposed between the first connection portion and the covered portion through the first electrode and the protection film,
a conductive layer having a relatively small electrical resistance is formed in an upper surface portion of each of the first connection portion and the first exposed portion, and
the second electrode is in contact with the upper surface of the first exposed portion.

2. A contact structure provided on a substrate, comprising:
an auxiliary gate electrode;
a gate insulating film covering the auxiliary gate electrode;
a second terminal provided on the gate insulating film;
a third electrode connected to the second terminal;
a protection film covering the second terminal and the third electrode; and
a connection electrode provided on the protection film and connected to the third electrode via the second terminal, wherein
the second terminal includes a metal oxide semiconductor including a conductive layer having a relatively small electrical resistance in an upper surface portion thereof,
the second terminal has a third connection portion having an upper surface in contact with the third electrode and covered by the protection film, and a second exposed portion having an upper surface exposed through or covered by the third electrode and exposed through the protection film,
an electrode exposed portion at which an upper surface of the auxiliary gate electrode is exposed through the gate insulating film is formed in the vicinity of the second exposed portion, and
the connection electrode is in contact with the upper surfaces of the electrode exposed portion and the second exposed portion.

3. An active matrix drive type substrate comprising:
a plurality of source lines extending in parallel to each other;
a plurality of gate lines extending in parallel to each other perpendicularly to the source lines;
a plurality of pixel electrodes provided in respective grid-square-like sub-regions separated by the source lines and the gate lines; and
a plurality of thin film transistors corresponding to the respective pixel electrodes,
wherein
the thin film transistor includes:
a gate electrode;
a gate insulating film covering the gate electrode;
a semiconductor facing the gate electrode with the gate insulating film being interposed between the semiconductor and the gate electrode;
a source electrode and a drain electrode connected together via the semiconductor; and
a protection film covering the semiconductor, the source electrode, and the drain electrode,
the semiconductor includes a metal oxide semiconductor,
the semiconductor has a source portion having an upper surface in contact with the source electrode, a drain portion in contact with the drain electrode at an upper surface spaced apart from the source electrode, and a channel portion provided between the source and drain portions and having an upper surface exposed through the source and drain electrodes,
a conductive layer having a relatively small electrical resistance is formed in an upper surface portion of each of the source and drain portions, and
the conductive layer is removed from an upper surface portion of the channel portion,
the gate electrode is connected to one of the plurality of gate lines, the source electrode is connected to one of the plurality of source lines, and the drain electrode is connected to one of the plurality of pixel electrodes,
a first contact structure is provided in a connection portion between the drain electrode and the pixel electrode, the first contact structure includes:
one of the plurality of gate lines covered by the gate insulating film;
a first terminal provided on the gate insulating film in the vicinity of the one of the plurality of gate lines;
a first electrode connected to the first terminal;
a protection film covering the first terminal and the first electrode; and
a second electrode provided on the protection film and connected to the first electrode via the first terminal, wherein
the first terminal includes a metal oxide semiconductor,
the first terminal has a first connection portion having an upper surface in contact with the first electrode, a covered portion in contact with the protection film at an upper surface spaced apart from the first electrode, and a first exposed portion having an upper surface exposed between the first connection portion and the covered portion through the first electrode and the protection film,
a conductive layer having a relatively small electrical resistance is formed in an upper surface portion of each of the first connection portion and the first exposed portion,
the second electrode is in contact with the upper surface of the first exposed portion, and
the first electrode serves as the drain electrode, and the second electrode serves as the pixel electrode.

4. The substrate of claim 3, further comprising:
a plurality of auxiliary capacitor lines extending in parallel to the gate lines;
a common line extending in parallel to the source lines and connected to all of the auxiliary capacitor lines; and
a plurality of capacitors connected to the respective corresponding drain electrodes and the respective corresponding auxiliary capacitor lines,
a second contact structure is provided at a connection portion between the auxiliary capacitor line and the common line, the second contact structure includes:
an auxiliary gate electrode covered by the gate insulating film;
a second terminal provided on the gate insulating film;
a third electrode connected to the second terminal;
a protection film covering the second terminal and the third electrode; and
a connection electrode provided on the protection film and connected to the third electrode via the second terminal, wherein the second terminal includes a metal oxide semiconductor including a conductive layer having a relatively small electrical resistance in an upper surface portion thereof, the second terminal has a third connection portion having an upper surface in contact with the third electrode and covered by the protection film, and a second exposed portion having an upper surface exposed through or covered by the third electrode and exposed through the protection film, an electrode exposed portion at which an upper surface of the auxiliary gate electrode is exposed through the gate insulating film is formed in the vicinity of the second exposed portion, the connection electrode is in contact with the upper surfaces of the electrode exposed portion and the second exposed portion, and the auxiliary gate electrode serves as one of the plurality of auxiliary capacitor lines, and the third electrode serves as the common line.

5. The substrate of claim 4, wherein
the metal oxide semiconductors of the semiconductor, the first terminal, and the second terminal are formed of the same material.

6. The substrate of claim 5, wherein
the metal oxide semiconductor of at least one of the first and second terminals has portions having different thicknesses.

7. The substrate of claim 5, wherein
the metal oxide semiconductor contains at least one of In, Ga, and Zn.

8. The substrate of claim 5, wherein
the pixel electrode and the connection electrode are formed of the same material.

9. A display device comprising an active matrix drive type substrate of claim 3.

10. The display device of claim 9, further comprising:
a plurality of pixels arranged in a matrix form.

* * * * *